(12) United States Patent
Kang et al.

(10) Patent No.: US 11,302,768 B2
(45) Date of Patent: Apr. 12, 2022

(54) DISPLAY PANEL

(71) Applicant: Samsung Display Co., Ltd., Yongin-Si (KR)

(72) Inventors: Chulkyu Kang, Yongin-si (KR); Jinwoo Park, Yongin-si (KR); Hyunchol Bang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/906,790

(22) Filed: Jun. 19, 2020

(65) Prior Publication Data

US 2020/0403057 A1 Dec. 24, 2020

(30) Foreign Application Priority Data

Jun. 21, 2019 (KR) .................. 10-2019-0074118

(51) Int. Cl.
*H01L 27/32* (2006.01)
*G09G 3/3225* (2016.01)

(52) U.S. Cl.
CPC ....... *H01L 27/3276* (2013.01); *G09G 3/3225* (2013.01); *G09G 2300/0426* (2013.01); *G09G 2300/0804* (2013.01); *G09G 2300/0809* (2013.01); *G09G 2310/0297* (2013.01); *G09G 2320/04* (2013.01)

(58) Field of Classification Search
CPC .............. H01L 27/124; H01L 27/3276; G09G 2300/0426; G09G 2300/0439; G09G 2300/0452; G09G 2300/0408; G09G 3/3233; G09G 3/3225; G09G 2300/0465; G09G 2310/0297
See application file for complete search history.

(56) References Cited

U.S. PATENT DOCUMENTS

| | | | |
|---|---|---|---|
| 9,887,256 B2 | 2/2018 | Kim et al. | |
| 10,490,620 B1 | 11/2019 | Lai et al. | |
| 2017/0294502 A1* | 10/2017 | Ka | H01L 27/3258 |
| 2018/0218684 A1 | 8/2018 | Choi et al. | |
| 2019/0051670 A1 | 2/2019 | Bei et al. | |
| 2019/0123066 A1* | 4/2019 | Zhan | H01L 27/1218 |
| 2019/0280076 A1 | 9/2019 | Bang et al. | |

FOREIGN PATENT DOCUMENTS

| | | |
|---|---|---|
| CN | 108878455 | 11/2018 |
| KR | 10-2014-0079089 | 6/2014 |
| KR | 10-2017-0071219 | 6/2017 |
| KR | 10-2017-0114028 | 10/2017 |
| KR | 10-2018-0003721 | 1/2018 |

* cited by examiner

*Primary Examiner* — Xuemei Zheng
(74) *Attorney, Agent, or Firm* — H.C. Park & Associates, PLC

(57) ABSTRACT

A display panel including a substrate having a first area, a display area, and an intermediate area between the first area and the display area; a plurality of data lines extending in a first direction in the display area; and a data distributor including switches electrically connected to the plurality of data lines. The plurality of data lines include a first data line and a second data line, and each of the first data line and the second data line bypasses an edge of the first area in the intermediate area, and a bypass portion of the first data line and a bypass portion of the second data line overlap each other in the intermediate area.

20 Claims, 35 Drawing Sheets

DISPLAY PANEL

CROSS REFERENCE TO RELATED APPLICATION

This application claims priority from and the benefit of Korean Patent Application No. 10-2019-0074118, filed on Jun. 21, 2019, which is hereby incorporated by reference for all purposes as if fully set forth herein.

BACKGROUND

Field

Exemplary embodiments of the invention relate generally to a display panel.

Discussion of the Background

The usage of display devices is diversifying. In addition, the thickness and the weight of the display devices are decreasing, and the range of use thereof is widening. Various functions for connecting or linking to display devices have been added while the area occupied by a display area in such display devices has increased.

The above information disclosed in this Background section is only for understanding of the background of the inventive concepts and, therefore, it may contain information that does not constitute prior art.

SUMMARY

As a method for adding various functions while increasing the area occupied by a display area, a display panel is being developed that utilizes a portion of the display area for various purposes. Exemplary embodiments of the present invention provide a display panel having a first area in which various functions may be combined or associated with a display panel.

Additional features of the inventive concepts will be set forth in the description which follows, and in part will be apparent from the description, or may be learned by practice of the inventive concepts.

An exemplary embodiment of the present invention provides a display panel including: a substrate including a first area, a display area, and an intermediate area between the first area and the display area; a plurality of data lines extending in a first direction in the display area; and a data distributor including switches electrically connected to the plurality of data lines. The plurality of data lines include a first data line and a second data line, and each of the first data line and the second data line bypasses an edge of the first area in the intermediate area, and a bypass portion of the first data line and a bypass portion of the second data line overlap each other in the intermediate area.

The data distributor may include a first switch electrically connected to the first data line, and a second switch electrically connected to the second data line, wherein the first switch and the second switch may be connected to the same demultiplexer control line.

The plurality of data lines may include a third data line and a fourth data line bypassing the edge of the first area in the intermediate area, and a bypass portion of the third data line and a bypass portion of the fourth data line may overlap each other in the intermediate area.

A shortest distance between the bypass portion of any one of the first data line and the second data line and the bypass portion of any one of the third data line and the fourth data line may be greater than a vertical distance between the bypass portion of the first data line and the bypass portion of the second data line or a vertical distance between the bypass portion of the third data line and the bypass portion of the fourth data line.

A separation distance between the first data line and the third data line in the display area may be greater than the shortest distance.

The third data line may be arranged between the first data line and the second data line in the display area.

The display panel may further include a first pixel circuit and a second pixel circuit located in the display area and arranged in the first direction, wherein one of the first data line and the third data line may be connected to the first pixel circuit, and the other of the first data line and the third data line may be electrically connected to the second pixel circuit.

One of the first data line and the second data line may include a bypass portion located in the intermediate area; and an extension portion located in the display area and connected to the bypass portion through a contact hole defined in at least one insulating layer interposed between the bypass portion and the extension portion.

The plurality of data lines may further include a fifth data line apart from the first data line and the second data line in the display area.

A bypass portion of the fifth data line bypassing the edge of the first area in the intermediate area may overlap the bypass portion of the first data line and the bypass portion of the second data line.

Another exemplary embodiment of the present invention provides a display panel including: a substrate including a first area, a display area, and an intermediate area between the first area and the display area; a plurality of pixels located in the display area; and a plurality of data lines for providing data signals to the plurality of pixels. The plurality of data lines include a first data line and a second data line, each of which includes an extension portion extending in a first direction in the display area and a bypass portion bypassing the first area in the intermediate area, and the bypass portion of the first data line and the bypass portion of the second data line overlap each other in the intermediate area.

The bypass portion and the extension portion of the first data line may be on the same layer, and the bypass portion and the extension portion of the second data line may be on different layers.

The plurality of data lines may further include a third data line and a fourth data line, each of which includes an extension portion extending in the first direction in the display area and a bypass portion bypassing the first area in the intermediate area, wherein the bypass portion of the third data line and the bypass portion of the fourth data line overlap each other in the intermediate area.

At least one of the third data line and the fourth data line may be arranged between the first data line and the second data line in the display area.

The display panel may further include a first pixel circuit and a second pixel circuit located in the display area and arranged in the first direction, and the third data line is disposed adjacent to the first data line in the display area, and any one of the first data line and the third data line may be electrically connected to the first pixel circuit and the other of the first data line and the third data line may be electrically connected to the second pixel circuit.

A shortest distance between the bypass portion of any one of the first data line and the second data line and the bypass portion of any one of the third data line and the fourth data line may be greater than a vertical distance between the bypass portion of the first data line and the bypass portion of the second data line or a vertical distance between the bypass portion of the third data line and the bypass portion of the fourth data line.

A separation distance between the first data line and the third data line in the display area may be greater than the shortest distance.

The display panel may further include a data distributor including switches electrically connected to the plurality of data lines.

The data distributor may include a first switch electrically connected to the first data line, and a second switch electrically connected to the second data line.

The first switch and the second switch may be electrically connected to the same demultiplexer control line.

The plurality of data lines may further include a fifth data line apart from the first data line and the second data line in the display area, and a bypass portion of the fifth data line bypassing the edge of the first area in the intermediate area may overlap the bypass portion of the first data line and the bypass portion of the second data line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
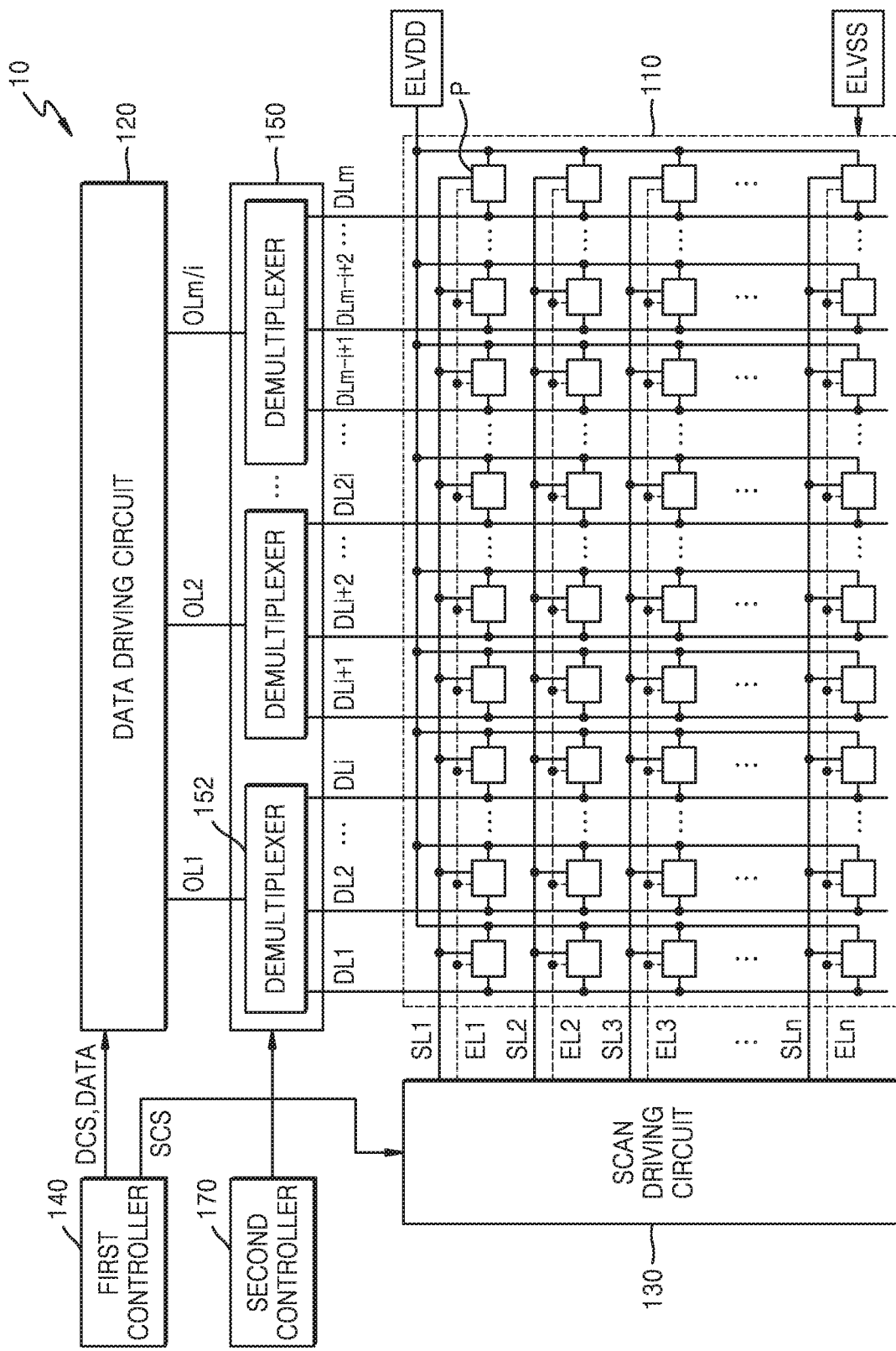
FIG. 1 is a block diagram of a display panel according to an exemplary embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram of a display panel according to an exemplary embodiment of the present invention.

Referring to FIG. 1, a display panel 10 may include a pixel array 110, a data driving circuit 120, a scan driving circuit 130, a first controller 140, a data distributor 150, and a second controller 170.

The pixel array 110 includes a plurality of pixels P, and the pixels P may be connected to a plurality of scan lines SL1 to SLn, a plurality of data lines DL1 to DLm, a plurality of emission control lines EL1 to ELn, and a first power supply voltage line. The plurality of scan lines SL1 to SLn are spaced apart from each other and extend in a first direction, and transmit a scan signal to each pixel P. The plurality of emission control lines EL1 to ELn may transmit emission control signals, respectively, and the first power supply voltage line may transmit a first power supply voltage ELVDD. The plurality of data lines DL1 to DLm are spaced apart from each other and extend in a second direction crossing the first direction, and transmit a data signal to each pixel P. The plurality of scan lines SL1 to SLn and the plurality of data lines DL1 to DLm may be arranged to intersect with each other, and pixel circuits of the pixels P may be disposed in crossing areas thereof. The pixel circuit of each pixel P may include a plurality of transistors and a storage capacitor. Each of the pixel circuits described above may be connected to a corresponding scan line, a data line, an emission control line, or the like.

The data driving circuit 120 may be connected to a plurality of output lines OL1 to OLm/i, and the plurality of output lines OL1 to OLm/i may be connected to the plurality of data lines DL1 to DLm through the data distributor 150. The data driving circuit 120 converts an image signal DATA into a data signal in the form of voltage or current according to a data driving control signal DCS input from the first controller 140.

The scan driving circuit 130 is connected to the plurality of scan lines SL1 to SLn. The scan driving circuit 130 may generate a scan signal according to a scan driving control signal SCS input from the first controller 140 and supply the scan signal to the scan lines SL1 to SLn. The scan driving circuit 130 may be connected to the plurality of emission control lines EL1 to ELn, generate an emission control signal according to the scan driving control signal SCS, and supply the emission control signal to the emission control lines EL1 to ELn. In the exemplary embodiment of FIG. 1, the scan driving circuit 130 generates the emission control signal and applies the emission control signal to the pixel array 110. However, in other exemplary embodiments, the emission control signal may be generated by a separate emission control driver.

The first controller 140 may generate the data driving control signal DCS and the scan driving control signal SCS in response to synchronization signals supplied from the outside. The first controller 140 may output the data driving control signal DCS to the data driving circuit 120 and may output the scan driving control signal SCS to the scan driving circuit 130.

The data distributor 150 may be connected to the plurality of output lines OL1 to OLm/i and may be connected to the plurality of data lines DL1 to DLm. The data distributor 150 may include m/i (where i is two or more natural numbers) demultiplexers 152 including a plurality of switching devices. For example, the data distributor 150 may include the same number of demultiplexers 152 as the number of output lines. One end of each demultiplexer 152 connected to one of the plurality of output lines OL1 to OLm/i. The other end of each demultiplexer 152 is connected to i data lines (i is natural number). The demultiplexer 152 supplies a data signal provided from one output line to each of i data lines. The number of output lines of the data driving circuit 120 need not be as many as the number of data lines because of using the demultiplexer 152, and thus, the number of output lines connected to the data driving circuit 120 may be reduced and the number of integrated circuits included in the data driving circuit 120 may be reduced.

The second controller 170 outputs the i control signals to each of the demultiplexers 152 such that the i data signals supplied to the output line are dividedly supplied to the i data lines. The i control signals are sequentially output so as not to overlap each other. In the exemplary embodiment of FIG. 1, the second controller 170 is provided separately from the first controller 140, but the second controller 170 may be a portion of the first controller 140.

The display panel 10 of FIG. 1 may be of various types, such as an organic light-emitting display panel, an inorganic light-emitting display panel, and a quantum dot light emitting display panel. In the following description, the display panel 10 is an organic light-emitting display panel for convenience of description.

Figure 2:
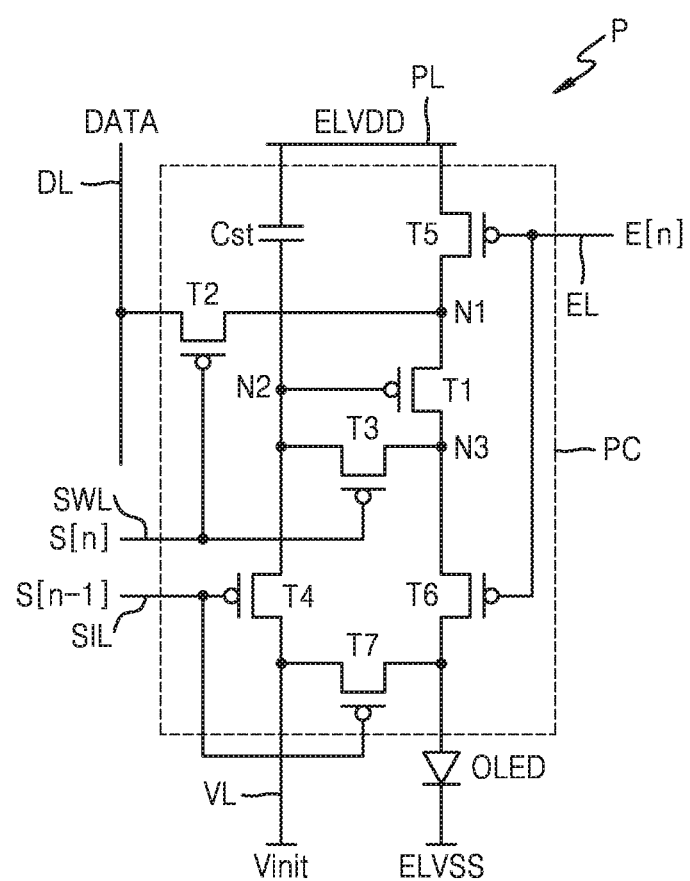
FIG. 2 is an equivalent circuit diagram of one pixel of a display panel according to an exemplary embodiment of the present invention.

FIG. 2 is an equivalent circuit diagram of one pixel of a display panel according to an exemplary embodiment.

Referring to FIG. 2, the pixel P may include a pixel circuit PC and a display element connected to the pixel circuit PC, for example, an organic light-emitting diode OLED.

A first transistor T1 includes a gate electrode connected to a first electrode of a storage capacitor Cst, a first electrode connected to a first node N1, and a second electrode connected to a third node N3. The first transistor T1 serves as a driving transistor and receives a data signal DATA according to a switching operation of a second transistor T2 to supply a current to the organic light-emitting diode OLED.

The second transistor T2 includes a gate electrode connected to a scan line SWL connected to the corresponding pixel circuit PC, a first electrode connected to a data line DL, and a second electrode connected to the first electrode of the first transistor T1 at the first node N1. The second transistor T2 is turned on in response to a scan signal S[n] received through the scan line SWL and performs a switching operation to transmit the data signal DATA transmitted to the data line DL to the first electrode of the first transistor T1.

A third transistor T3 includes a gate electrode connected to the scan line SWL, a first electrode connected to the second electrode of the first transistor T1 at the third node N3, and a second electrode connected to a gate electrode of the first transistor T1, a first electrode of the storage capacitor Cst, and a second electrode of a fourth transistor T4 at a second node N2. The third transistor T3 is turned on in response to the first scan signal S[n] received through the scan line SWL to diode-connect the first transistor T1.

The fourth transistor T4 includes a gate electrode connected to a previous scan line SIL, a first electrode connected to an initialization voltage line VL and the second electrode connected to the gate electrode of the first transistor T1, the first electrode of the storage capacitor Cst, and a second electrode of the third transistor T3 at the second node N2. The first electrode and the second electrode of the fourth transistor T4 may be a source electrode and a drain electrode in a current direction, respectively. The fourth transistor T4 is turned on in response to a previous scan signal S[n−1] received through the previous scan line SIL and transmits the initialization voltage Vinit to the gate electrode of the first transistor T1 to initialize a voltage of the gate electrode of the first transistor T1.

A fifth transistor T5 includes a gate electrode connected to an emission control line EL, a first electrode connected to a first power supply voltage line PL, and a second electrode connected to the first electrode of the first transistor T1 and the second electrode of the second transistor T2 at the first node N1.

A sixth transistor T6 includes a gate electrode connected to the emission control line EL, a first electrode connected to the second electrode of the first transistor T1 and the first electrode of the third transistor T3 at the third node N3, and a second electrode connected to an anode electrode of the organic light-emitting diode OLED.

The fifth transistor T5 and the sixth transistor T6 are simultaneously turned on in response to an emission control signal E[n] received through the emission control line EL so that the first power supply voltage ELVDD is transmitted to the organic light-emitting diode OLED, and a current flows through the organic light-emitting diode OLED.

A seventh transistor T7 includes a gate electrode connected to the previous scan line SIL, a first electrode connected to an initialization voltage line VL, and a second electrode connected to a second electrode of the sixth transistor T6 and the anode electrode of the organic light-emitting diode OLED. The first electrode and the second electrode of the seventh transistor may be a source electrode and a drain electrode in the current direction, respectively. The seventh transistor T7 is turned on in response to the previous scan signal S[n−1] received through the previous scan line SIL and transmits the initialization voltage Vinit to the anode electrode of the organic light-emitting diode OLED to initialize a voltage of the anode electrode of the organic light-emitting diode OLED.

The storage capacitor Cst includes a first electrode connected to the second electrode of the fourth first transistor T4, the gate electrode of the first transistor T1 and a second electrode of the third transistor T3 at the second node N2, and a second electrode connected to the first power supply voltage line PL.

A cathode electrode of the organic light-emitting diode OLED is connected to a second power supply for supplying a second power supply voltage ELVSS.

The exemplary embodiment of FIG. 2 illustrates that the previous scan line SIL is connected to a gate electrode of the seventh transistor T7, but the inventive concepts are not limited thereto. In other exemplary embodiments, the gate electrode of the seventh transistor T7 may be connected to the scan line SWL or a next scan line.

Figure 3:
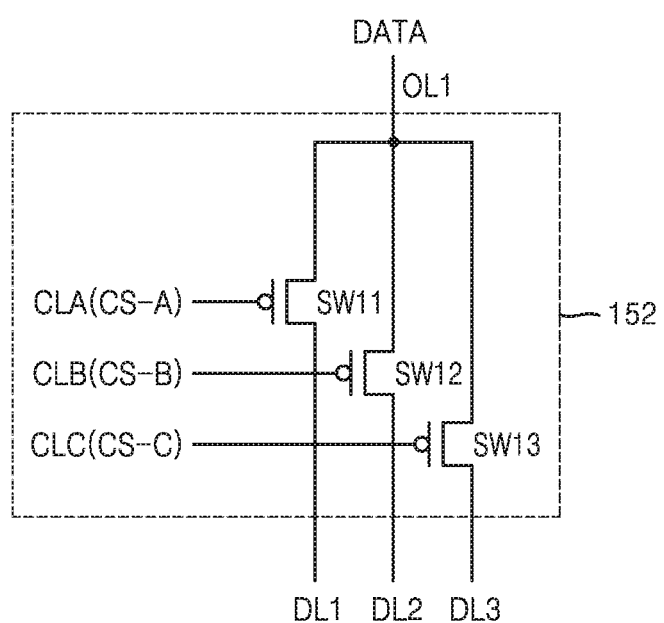
FIG. 3 is a view of an internal circuit of a demultiplexer according to an exemplary embodiment of the invention.
Figure 4:
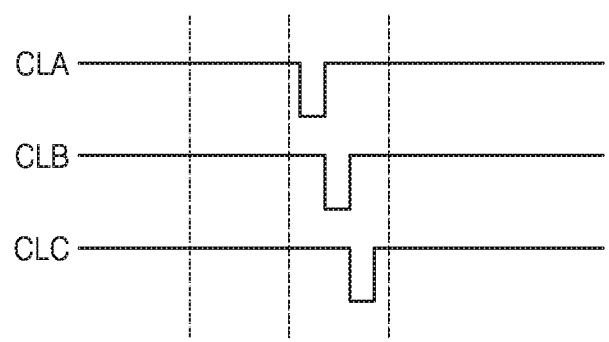
FIG. 4 is a timing diagram of control signals applied to a data distributor when driving a display panel according to an exemplary embodiment of the present invention.

FIG. 3 is a view of an internal circuit of a demultiplexer according to an exemplary embodiment, and FIG. 4 is a timing diagram of control signals applied to a data distributor when driving a display panel according to an exemplary embodiment. For convenience of description, FIG. 3 illustrates a structure in which one demultiplexer is connected to three data lines, that is, a case where i is 3 (i=3) in a display panel 10 described with reference to FIG. 1.

Referring to FIG. 3, the demultiplexer 152 may include the same number of demultiplexer switches (hereinafter referred to as switches) as the number of data lines connected to the demultiplexer 152. For example, the demultiplexer 152 may include a first switch SW11, a second switch SW12, and a third switch SW13.

The first switch SW11 is provided between a first output line OL1 and a first data line DL1. The first switch SW11 may apply the data signal DATA, which is applied through the first output line OL1, to the first data line DL1 by a first control signal CS-A applied through a first demultiplexer control line CLA.

The second switch SW12 is provided between the first output line OL1 and a second data line DL2. The second switch SW12 may apply the data signal DATA, which is applied through the first output line OL1, to the second data line DL2 by a second control signal CS-B applied through a second demultiplexer control line CLB.

The third switch SW13 is provided between the first output line OL1 and a third data line DL3. The third switch SW13 may apply the data signal DATA, which is applied through the first output line OL1, to the third data line DL3 by a third control signal CS-C applied through a third demultiplexer control line CLC.

Each of the first data line DL1, the second data line DL2, and the third data line DL3 of FIG. 3 may be connected to the pixel circuit PC described with reference to FIG. 2. The data signal DATA may be sequentially applied to the first data line DL1, the second data line DL2, and the third data line DL3. Referring to FIG. 4, the first control signal CS-A, the second control signal CS-B, and the third control signal CS-C are sequentially input to the first switch SW11, the second switch SW12, and the third switch SW13, respectively. Accordingly, the first switch SW11, the second switch SW12, and the third switch SW13 are sequentially turned on, and the data signal DATA is sequentially applied to the first data line DL1, the second data line DL2, and the third data line DL3.

Figure 5:
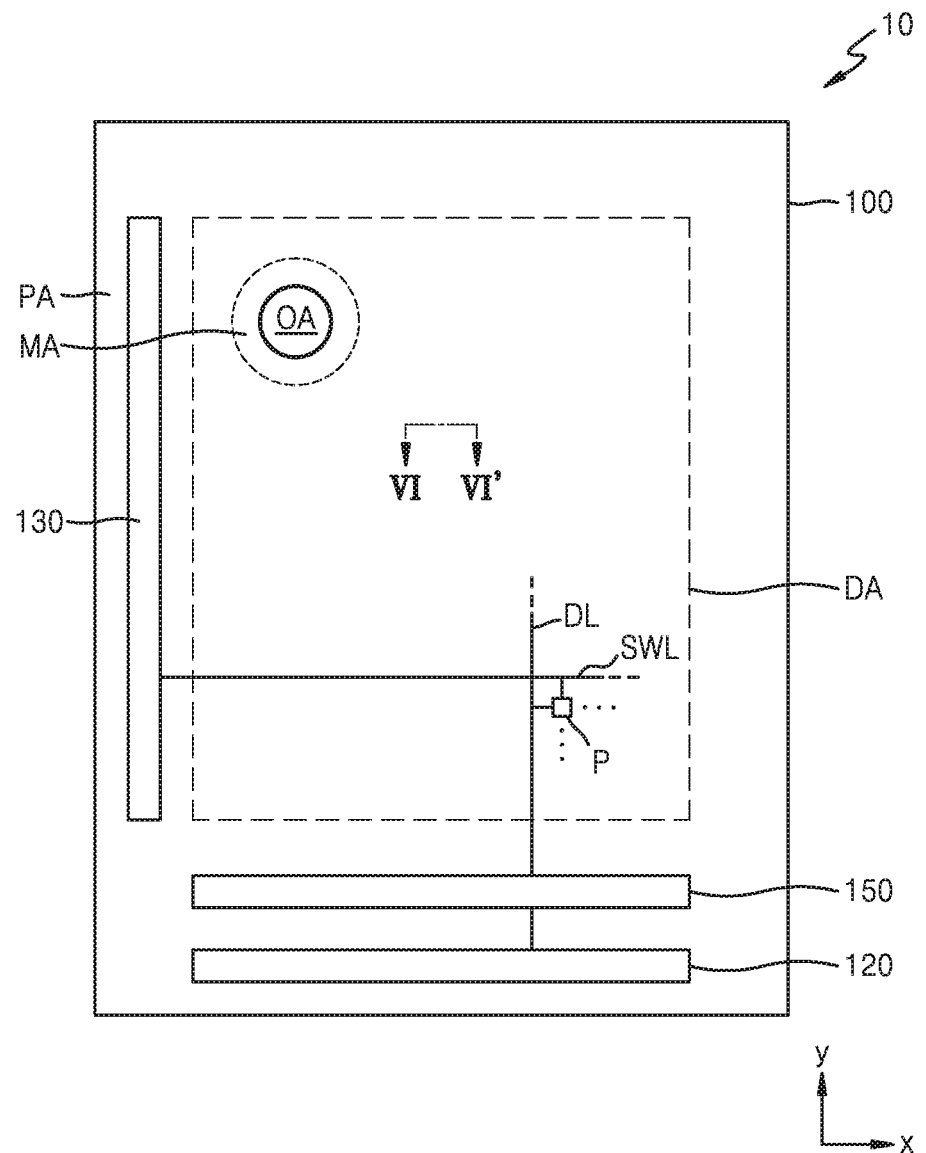
FIG. 5 is a plan view of a display panel according to an exemplary embodiment of the present invention.

FIG. 5 is a plan view of a display panel according to an exemplary embodiment of to present invention.

Referring to FIG. 5, the display panel 10 may include a first area OA, a display area DA as a second area, an intermediate area MA as a third area, and a peripheral area PA as a fourth area. The first area OA may be inside the display area DA and may be entirely surrounded by the display area DA. As described later below, the first area OA may be an area in which a component is disposed. According to the type of component, the display panel 10 may include a through-hole in the first area OA or may not include a through-hole. When a through-hole is not provided in the first area OA, pixels may not be in the first area OA or may be only in a portion of the first area OA.

The display area DA is an area in which the pixels P are arranged, and the display area DA may provide a certain image through the pixels P. Each pixel P may emit, for example, red, green, or blue light from the organic light-emitting diode OLED. Alternatively, each pixel P may emit, for example, red, green, blue, or white light from the organic light-emitting diode OLED.

The intermediate area MA may be arranged between the first area OA and the display area DA, which is the second area. The peripheral area PA may entirely surround the display area DA. The intermediate area MA and the peripheral area PA may be a kind of non-display area in which pixels are not disposed. For example, the intermediate area MA may be entirely surrounded by the display area DA, and the display area DA may be entirely surrounded by the peripheral area PA.

In the peripheral area PA, as described above with reference to FIG. 1, the data driving circuit 120, the scan driving circuit 130, and the data distributor 150 may be located, and the first power supply voltage line for supplying the first power supply voltage ELVDD (of FIG. 1) and the second power supply voltage line for supplying the second power supply voltage ELVSS (of FIG. 1) may be arranged. The data distributor 150 may be located between one side of the display area DA and one side of a substrate 100.

FIG. 5 illustrates a shape of the substrate 100 of the display panel 10. For example, the substrate 100 may have the first area OA, the display area DA, the intermediate area MA, and the peripheral area PA.

Although FIG. 5 shows that one first area OA is provided and is substantially circular, the inventive concepts are not limited thereto. In another exemplary embodiment, the number of first areas OA may be two or more, and the shape of the first areas OA may vary, such as a circle, an oval, a polygon, a star, or a diamond.

Figure 6:
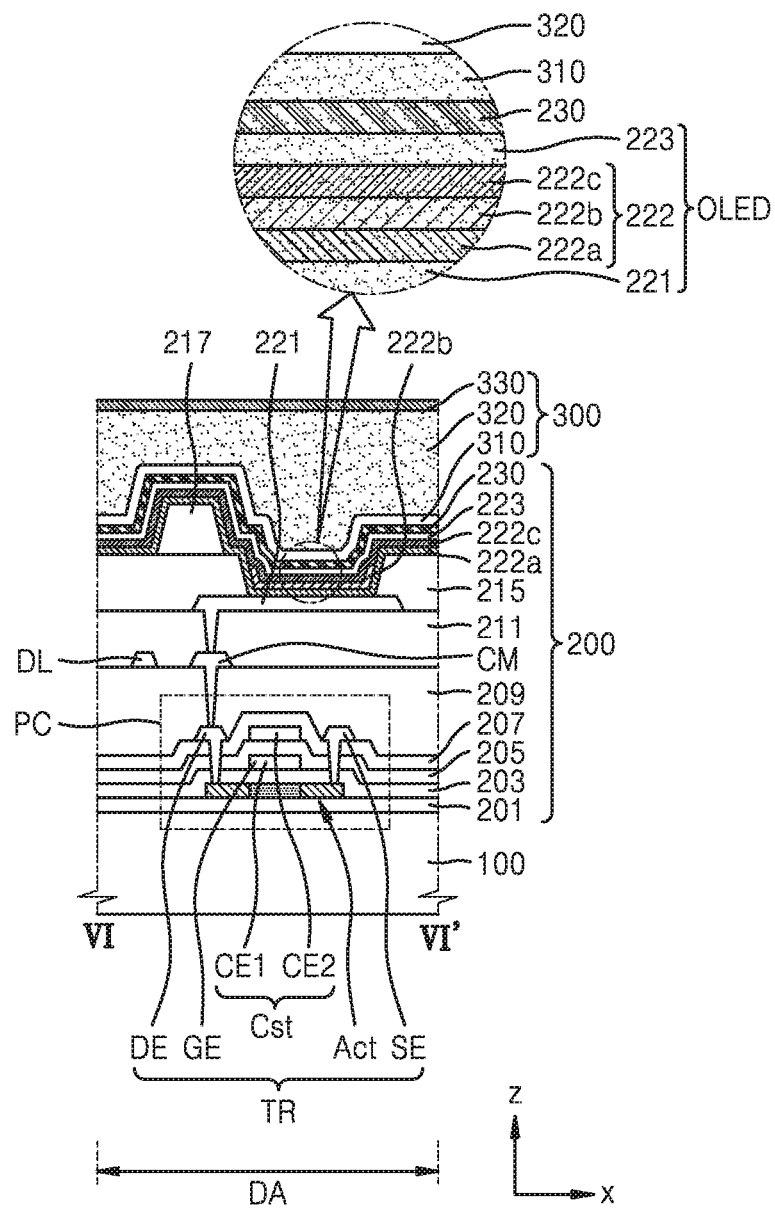
FIG. 6 is a cross-sectional view taken along line VI-VI' of FIG. 5.

FIG. 6 is a cross-sectional view taken along line VI-VI' of FIG. 5.

Referring to FIG. 6, the substrate 100 may include a glass material or a polymer resin. In an exemplary embodiment, the substrate 100 may include a glass substrate mainly composed of $SiO_2$. Alternatively, the substrate 100 may include a base layer including a polymer resin and a barrier layer including an inorganic insulator. For example, the substrate 100 may include a first base layer, a first barrier layer, a second base layer, and a second barrier layer that are sequentially stacked.

A buffer layer 201 may be formed on the substrate 100 to prevent impurities from penetrating into a semiconductor layer Act of a transistor TR. The buffer layer 201 may include an inorganic insulator such as silicon nitride, silicon oxynitride, and silicon oxide, and may include a single layer or multiple layers including the inorganic insulator described above.

The pixel circuit PC may be on the buffer layer 201. The pixel circuit PC includes the transistor TR and the storage capacitor Cst. The transistor TR may include a semiconductor layer Act, a gate electrode GE, a source electrode SE, and a drain electrode DE. The transistor TR shown in FIG. 6 may be the first transistor described with reference to FIG. 2. The present exemplary embodiment shows a top gate type transistor in which the gate electrode GE is on the semiconductor layer Act with a gate insulating layer 203 as a center. However, according to other exemplary embodiments, the transistor TR may be a bottom gate type transistor.

The semiconductor layer Act may include polysilicon. Alternatively, the semiconductor layer Act may include amorphous silicon, an oxide semiconductor, an organic semiconductor, and/or the like. The gate electrode GE may include a low resistance metal material. The gate electrode GE may include a conductive material including molybdenum (Mo), aluminum (Al), copper (Cu), titanium (Ti), and/or the like. The gate electrode GE may include a single layer or multiple layers including the above-described materials.

The gate insulating layer 203 between the semiconductor layer Act and the gate electrode GE may include an inorganic insulator such as silicon oxide, silicon nitride, silicon oxynitride, aluminum oxide, titanium oxide, tantalum oxide, hafnium oxide, and/or the like. The gate insulating layer 203 may include a single layer or multiple layers including the above-described materials.

The storage capacitor Cst may include a lower electrode CE1 and an upper electrode CE2 which overlap each other with a first interlayer insulating layer 205 therebetween. The storage capacitor Cst may overlap the transistor TR. In this regard, FIG. 6 shows that the gate electrode GE of the transistor TR is the lower electrode CE1 of the storage capacitor Cst. In other exemplary embodiments, the storage capacitor Cst may not overlap the transistor TR.

The storage capacitor Cst may be covered with a second interlayer insulating layer 207. The upper electrode CE2 of the storage capacitor Cst may include a conductive material including Mo, Al, Cu, Ti, and/or the like. The upper electrode CE2 of the storage capacitor Cst may include a single layer or multiple layers including the above material.

The source electrode SE and the drain electrode DE may include a material having good conductivity. The source electrode SE and the drain electrode DE may include a conductive material including Mo, Al, Cu, Ti, and/or the like. The source electrode SE and the drain electrode DE may include a single layer or multiple layers including the above-described materials. In an exemplary embodiment, the source electrode SE and the drain electrode DE may include multilayer structure of Ti/Al/Ti, respectively.

The first interlayer insulating layer 205 and the second interlayer insulating layer 207 may include an inorganic insulator, such as silicon oxide, silicon nitride, silicon oxynitride, aluminum oxide, titanium oxide, tantalum oxide, hafnium oxide, and/or the like. The first interlayer insulating layer 205 and the second interlayer insulating layer 207 may include a single layer or multiple layers including the above materials.

The pixel circuit PC including the transistor TR and the storage capacitor Cst may be covered with a third interlayer insulating layer 209. The third interlayer insulating layer 209 may include an approximately planar top surface.

The pixel circuit PC may be electrically connected to a pixel electrode 221. For example, as shown in FIG. 6, a contact metal layer CM may be disposed between the transistor TR and the pixel electrode 221. The contact metal layer CM may be connected to the transistor TR through a contact hole formed in the third interlayer insulating layer 209, and the pixel electrode 221 may be connected to the contact metal layer CM through a contact hole formed in a planarization insulating layer 211. The planarization insulating layer 211 may be arranged on the contact metal layer CM.

The data line DL may be on the third interlayer insulating layer 209. The data line DL and the contact metal layer CM may include a conductive material including Mo, Al, Cu, Ti, and/or the like. The data line DL and the contact metal layer CM may include a single layer or multiple layers including the above-described materials. In an exemplary embodiment, the data line DL and the contact metal layer CM may include a multilayer structure of Ti/Al/Ti.

The third interlayer insulating layer 209 may include an organic insulator and/or an inorganic insulator. The organic insulator may include a general polymer such as polymethylmethacrylate (PMMA) or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, and/or a blend thereof. For example, the third interlayer insulating layer 209 may include polyimide. The inorganic insulator may include silicon oxide, silicon nitride, and/or silicon oxynitride.

The planarization insulating layer 211 may include an organic insulation material, such as a general commercial polymer such as PMMA or PS, a polymer derivative including a phenolic group, an acrylic polymer, an imide polymer, an aryl ether polymer, an amide polymer, a fluorine-based polymer, a p-xylene-based polymer, a vinyl alcohol polymer, and/or a blend thereof. In an exemplary embodiment, the planarization insulating layer 211 may include polyimide.

The pixel electrode 221 may be formed on the planarization insulating layer 211. The pixel electrode 221 may include a conductive oxide, such as indium tin oxide (ITO), indium zinc oxide (IZO), zinc oxide (ZnO), indium oxide ($In_2O_3$), indium gallium oxide (IGO), and/or aluminum zinc oxide (AZO). In another exemplary embodiment, the pixel electrode 221 may include a reflective layer including Ag, Mg, Al, Pt, Pd, Au, Ni, Nd, Ir, Cr, and/or a compound thereof. In another exemplary embodiment, the pixel electrode 221 may include a film that includes ITO, IZO, ZnO, or $In_2O_3$ and is above/below the reflective layer.

A pixel defining layer 215 may be formed on the pixel electrode 221. The pixel defining layer 215 may include an opening exposing a portion of an upper surface of the pixel electrode 221 and may cover an edge of the pixel electrode 221. The pixel defining layer 215 may include an organic insulator. Alternatively, the pixel defining layer 215 may include an inorganic insulator such as silicon nitride ($SiN_x$), silicon oxynitride (SiON), and/or silicon oxide ($SiO_x$). Alternatively, the pixel defining layer 215 may include an organic insulator and an inorganic insulator.

An intermediate layer 222 includes a light emitting layer 222b. The intermediate layer 222 may include a first functional layer 222a under the light emitting layer 222b and/or a second functional layer 222c on the light emitting layer 222b. The light emitting layer 222b may include a polymer or a low molecular weight organic material that emits light of a certain color.

The first functional layer 222a may include a single layer or multiple layers. For example, when the first functional layer 222a includes a polymer, the first functional layer 222a may include a hole transport layer (HTL) having a single-layer structure and may include 3,4-ethylene-dihydroxythiophene (PEDOT) or polyaniline (PANI). When the first functional layer 222a includes a low molecular material, the first functional layer 222a may include a hole injection layer (HIL) and a hole transport layer (HTL).

The second functional layer 222c may be optional. For example, when the first functional layer 222a and the light emitting layer 222b include a polymer organic material, it is preferable to form the second functional layer 222c. The second functional layer 222c may include a single layer or multiple layers. The second functional layer 222c may include an electron transport layer (ETL) and/or an electron injection layer (EIL).

The light emitting layer 222b in the intermediate layer 222 may be arranged for each pixel in the display area DA. The light emitting layer 222b may be patterned to correspond to the pixel electrode 221. Unlike the light emitting layer 222b, the first functional layer 222a and/or the second functional layer 222c are integrally formed as a common layer to correspond to a plurality of pixels. The first functional layer 222a and/or the second functional layer 222c may be present in the intermediate area MA as well as the display area DA.

The opposite electrode 223 may include a conductive material having a low work function. For example, the opposite electrode 223 may include a (semi) transparent electrode including Ag, Mg, Al, Pt, Pd, Au, Ni, Nd, Ir, Cr, and/or an alloy thereof. Alternatively, the opposite electrode 223 may further include a layer such as ITO, indium zinc oxide (IZO), zinc oxide (ZnO), or indium oxide ($In_2O_3$) on the (semi) transparent layer including the above-mentioned material. The opposite electrode 223 may be formed not only in the display area DA but also in the intermediate area MA. The first functional layer 222a, the second functional layer 222c, and the opposite electrode 223 may be formed by thermal evaporation.

A capping layer 230 may be arranged on the opposite electrode 223. For example, the capping layer 230 may include LiF and may be formed by thermal evaporation. In some exemplary embodiments, the capping layer 230 may be omitted.

A spacer 217 may be formed on the pixel defining layer 215. The spacer 217 may include an organic insulator, such as polyimide. Alternatively, the spacer 217 may include an inorganic insulator, or may include an organic insulator and an inorganic insulator.

The spacer 217 may include a material different from that of the pixel defining layer 215, or may include the same material as that of the pixel defining layer 215. For example, the pixel defining layer 215 and the spacer 217 may be formed together in a mask process using a halftone mask. In an exemplary embodiment, the pixel defining layer 215 and the spacer 217 may include polyimide.

A display layer 200 including the aforementioned components stacked from the buffer layer 201 to the capping layer 230 may be covered with an encapsulation member. The encapsulation member may include a thin film encapsulation layer 300 covering the organic light-emitting diode OLED.

The thin film encapsulation layer 300 may include at least one organic encapsulation layer and at least one inorganic encapsulation layer. For example, FIG. 6 shows that the thin film encapsulation layer 300 includes a first inorganic encapsulation layer 310, a second inorganic encapsulation layer 330, and an organic encapsulation layer 320 arranged therebetween. In another exemplary embodiment, the number of organic encapsulation layers, the number of inorganic encapsulation layers, and a stacking order may vary.

The first inorganic encapsulation layer 310 and the second inorganic encapsulation layer 330 may include one or more inorganic materials selected from aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may include a single layer or multiple layers including the aforementioned materials. The organic encapsulation layer 320 may include a polymer-based material. Examples of the polymer-based material may include an acrylic resin, an epoxy resin, polyimide, and/or polyethylene. In an exemplary embodiment, the organic encapsulation layer 320 may include acrylate.

Thicknesses of the first inorganic encapsulation layer 310 and the second inorganic encapsulation layer 330 may be different from each other. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the thicknesses of the first inorganic encapsulation layer 310 and the second inorganic encapsulation layer 330 may be the same.

Figure 7:
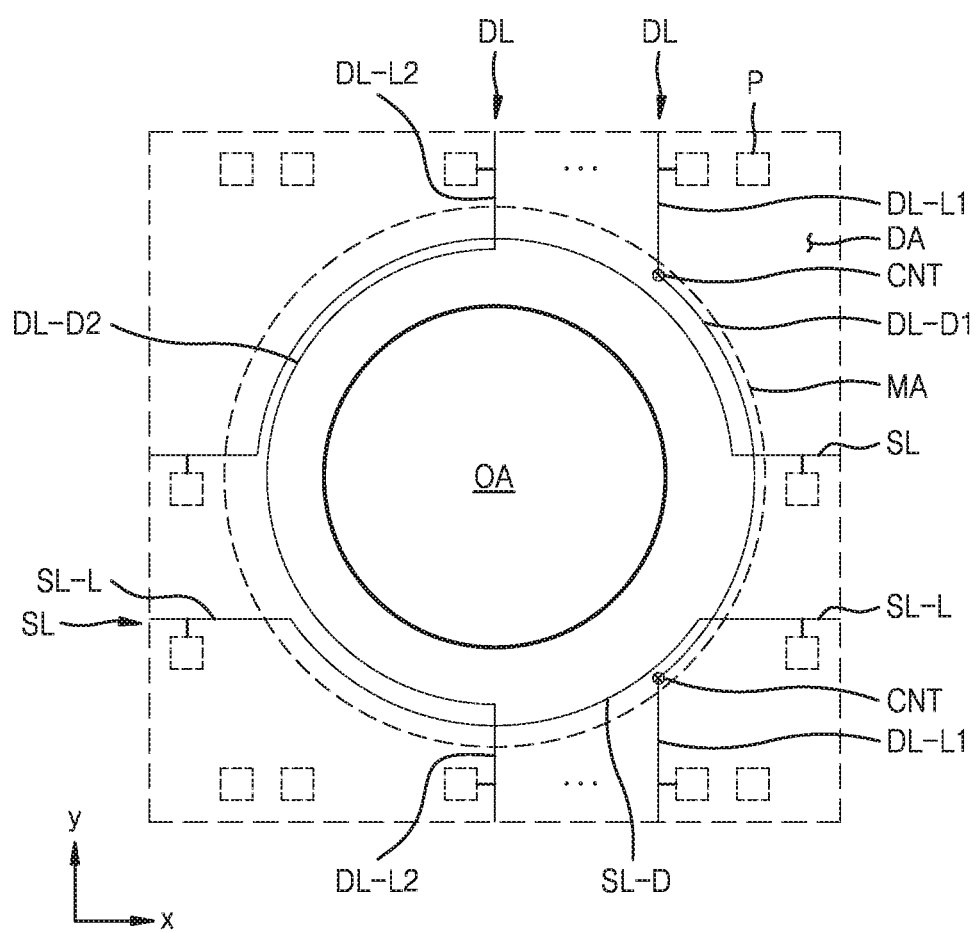
FIG. 7 is an enlarged plan view of a first area and a periphery of a display panel according to an exemplary embodiment of the present invention.

FIG. 7 is an enlarged plan view of a first area and a periphery of a display panel according to an exemplary embodiment of the present invention.

Referring to FIG. 7, the pixels P are arranged in the display area DA around the first area OA. Some pixels P may be spaced apart from each other with respect to the first area OA, and the first area OA may be defined between the pixels P. For example, the pixels P may be disposed above and below or on the left and right of the first area OA, respectively.

Signal lines adjacent to the first area OA among signal lines for supplying signals to the pixels P may bypass the first area OA. For example, some of the data lines DL passing across the display area DA on the plane of FIG. 7 extend in a y direction to provide data signals to the pixels P arranged above and below the opening area OA, and may pass along an edge of the first area OA in the intermediate area MA. On the plane, some of the scan lines SL passing across the display area DA extend in the x direction to provide scan signals to the pixels P arranged on the left and right of the first area OA, and may pass along the edge of the first area OA in the intermediate area MA.

The bypass portion (or circuitous portion) SL-D of the scan lines SL is on the same layer as an extension portion SL-L crossing the display area DA and may be integrally formed. A bypass portion DL-D1 of at least one of the data lines DL may be formed on a layer different from an extension portion DL-L1 crossing the display area DA. The bypass portion DL-D1 of the data line DL and the extension portion DL-L1 may be connected to each other through a contact hole CNT. A bypass portion DL-D2 of at least one of the data lines DL is on the same layer as an extension portion DL-L2 and may be integrally formed.

The intermediate area MA may be an area in which the data lines DL and the scan lines SL bypass the first area OA. As described above, the intermediate area MA is a kind of non-display area, and it is required to reduce the area of the intermediate area MA, and a gap (or a pitch) between adjacent signal lines in the intermediate area MA is less than a gap between adjacent signal lines in the display area DA. For example, a gap (or a pitch) between adjacent data lines DL in the intermediate area MA is less than a gap (or a pitch) between adjacent data lines DL in the display area DA.

Figure 8:
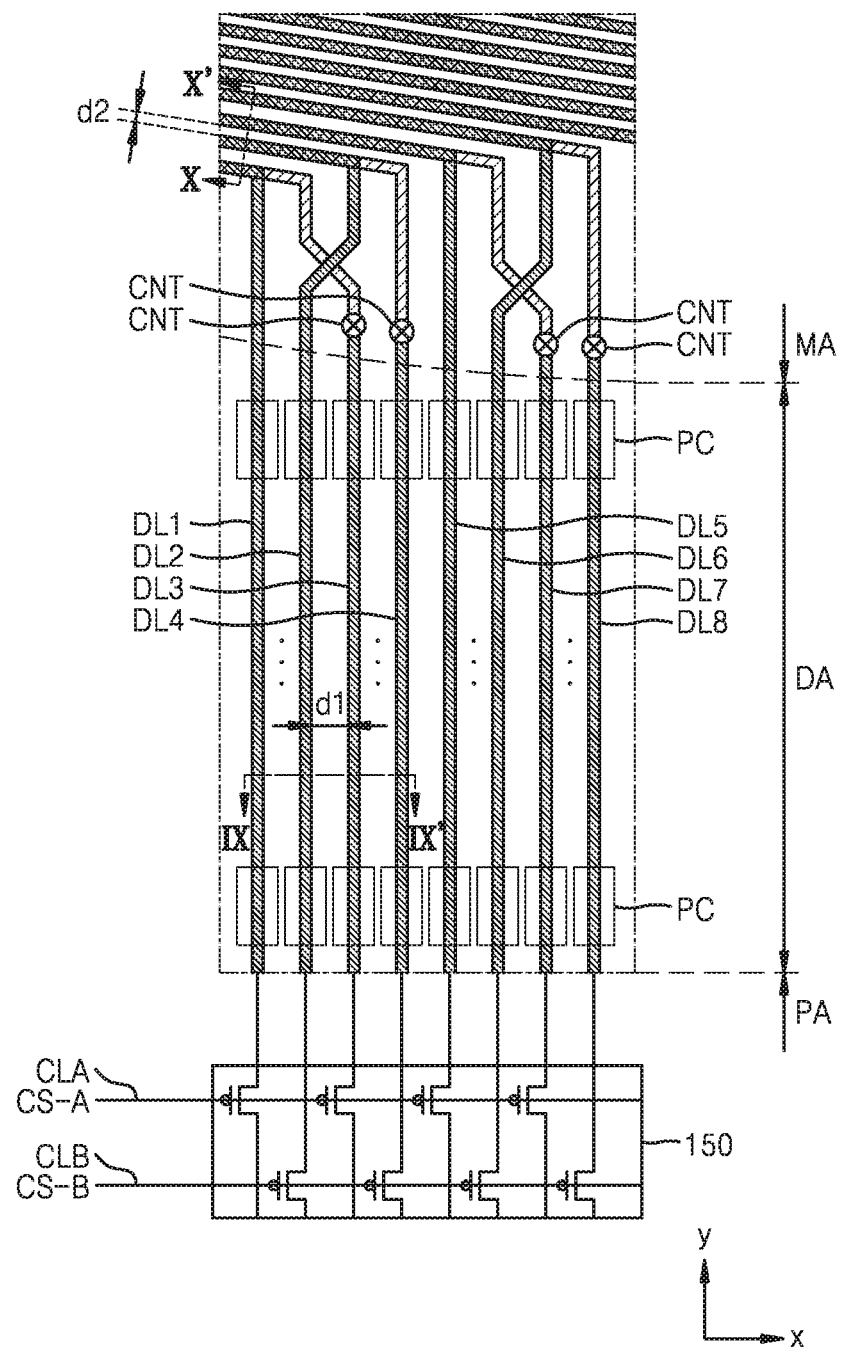
FIG. 8 is a plan view of data lines of a display panel according to an exemplary embodiment of the present invention.
Figure 9:
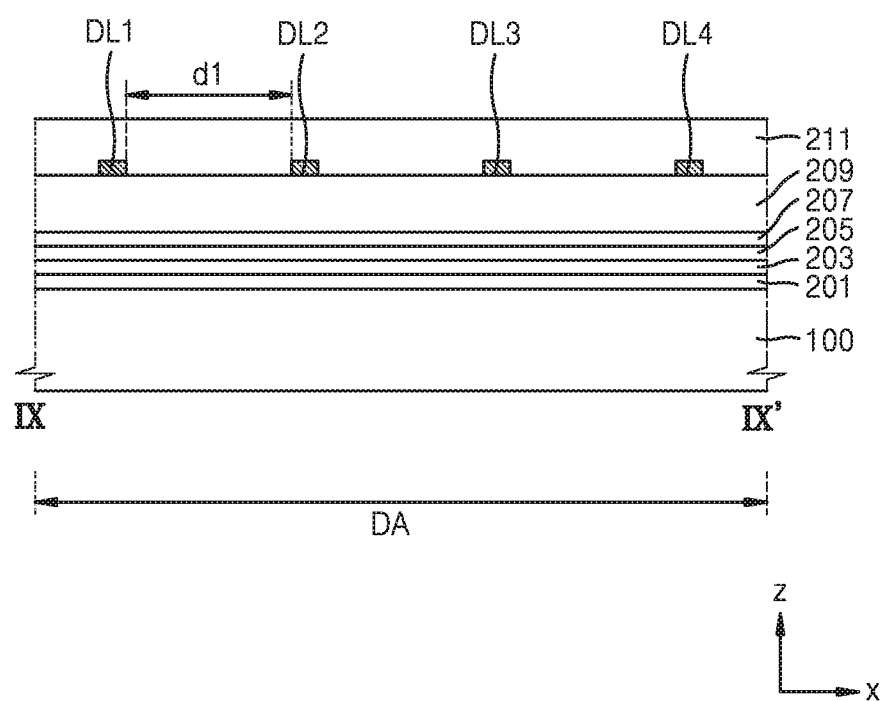
FIG. 9 is a cross-sectional view taken along line IX-IX' of FIG. 8.
Figure 10:
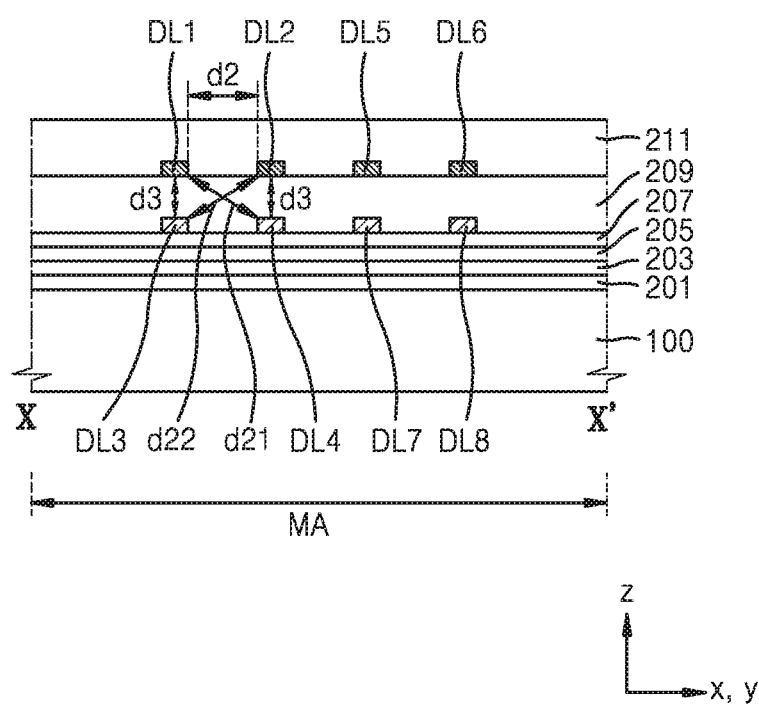
FIG. 10 is a cross-sectional view taken along line X-X' of FIG. 8.

FIG. 8 is a plan view of data lines of a display panel according to an exemplary embodiment; FIG. 9 is a cross-sectional view taken along line IX-IX' of FIG. 8; and FIG. 10 is a cross-sectional view taken along line X-X' of FIG. 8.

Referring to FIG. 8, data lines extend in the y direction in the display area DA. The first to eighth data lines DL1, DL2, DL3, DL4, DL5, DL6, DL7, and DL8 may be spaced apart from adjacent data lines, respectively. Distance "d1" shown in FIG. 8 is a separation distance between adjacent data lines, hereinafter referred to as a first distance. Portions of the first to eighth data lines DL1, DL2, DL3, DL4, DL5, DL6, DL7, and DL8 that are disposed in the display area DA may be on the same layer, for example, the third interlayer insulating layer 209, as shown in FIG. 9.

In the display area DA, pixel circuits PC corresponding to each of pixels may be arranged to form a row and a column. Each pixel circuit PC is connected to an organic light-emitting diode, and the organic light-emitting diodes may be arranged in a Pentile shape or a matrix shape.

Each of the first to eighth data lines DL1, DL2, DL3, DL4, DL5, DL6, DL7, and DL8 may be electrically connected to the pixel circuit PC of the corresponding pixel to provide a data signal. Each pixel circuit PC may include a plurality of transistors and a storage capacitor as described above with reference to FIG. 2.

As described above with reference to FIG. 5, the data lines are electrically connected to the data driving circuit 120. The data distributor 150 may be located between the data lines and the data driving circuit 120. In this regard, FIG. 8 shows that the first to eighth data lines DL1, DL2, DL3, DL4, DL5, DL6, DL7, and DL8 are connected to the data distributor 150.

As described above with reference to FIGS. 1 and 3, the data distributor 150 includes switches for performing a switching operation by the first control signal CS-A and the second control signal CS-B, and data signals may be selectively or sequentially applied to the first to eighth data lines DL1, DL2, DL3, DL4, DL5, DL6, DL7, and DL8 by the switching operation of the switches.

Data lines extending in the y direction in the display area DA extend in the intermediate area MA by changing their directions. For example, as described above with reference to FIG. 7, the data lines may extend in a direction different from the y direction to bypass the first area OA (of FIG. 7) in the intermediate area MA. FIG. 8 shows a portion of the first to eighth data lines DL1, DL2, DL3, DL4, DL5, DL6, DL7, and DL8 extending to bypass the first area OA (of FIG. 7) in the intermediate area MA.

In order to reduce the area of the intermediate area MA, for example, the area of a dead area not displaying an image, a distance in a horizontal direction between adjacent data lines in the intermediate area MA (hereinafter referred to as a second distance d2) may be less than a distance in a horizontal direction between adjacent data lines in the display area DA (hereinafter referred to as the first distance d1). When coupling occurs between data lines arranged at relatively narrow intervals, for example, between bypass portions of adjacent data lines in the intermediate area MA, the quality of an image provided in the display area DA may be degraded. However, according to exemplary embodiments, the occurrence of the aforementioned coupling may be reduced by overlapping bypass portions of data lines connected to switches operating based on the same control signal among control signals applied to the data distributor 150.

For example, switches connected to the first data line DL1 and the third data line DL3 may be connected to the same first demultiplexer control line CLA and are switched by the same first control signal CS-A. As described above, the first data line DL1 and the third data line DL3 based on the same control signal may overlap each other in the intermediate area MA. In other words, a bypass portion of the first data line DL1 in the intermediate area MA and a bypass portion of the third data line DL3 in the intermediate area MA may at least partially overlap each other.

First portions of the first data line DL1 and the third data line DL3 in the display area DA may be on the same layer, for example, the third interlayer insulating layer 209, as shown in FIG. 9. A second portion (the bypass portion) of the first data line DL1 passing across the intermediate area MA extends integrally with the first portion passing across the display area DA, whereas a second portion (the bypass portion) of the third data line DL3 passing across the intermediate area MA may be on the second interlayer insulating layer 207, as shown in FIG. 10. The first portion and the second portion of the third data line DL3 may be connected to each other through the contact hole CNT defined in the third interlayer insulating layer 209. The second portion of the third data line DL3 overlaps the second portion of the first data line DL1 in the intermediate area MA, as shown in FIG. 10.

Switches respectively connected to the second data line DL2 and the fourth data line DL4 may be connected to the same second demultiplexer control line CLB, and are switched by the same second control signal CS-B. As described above, the second data line DL2 and the fourth data line DL4 based on the same control signal may overlap each other in the intermediate area MA. In other words, a bypass portion of the second data line DL2 in the intermediate area MA and a bypass portion of the fourth data line DL4 in the intermediate area MA may overlap each other.

First portions of the second data line DL2 and the fourth data line DL4 in the display area DA may be on the same layer, for example, the third interlayer insulating layer 209 as shown in FIG. 9. A second portion (the bypass portion) of the second data line DL2 passing across the intermediate area MA extends integrally with the first portion passing across the display area DA, whereas a second portion (the bypass portion) of the fourth data line DL4 passing across the intermediate area MA may be on the second interlayer insulating layer 207, as shown in FIG. 10. A first portion and a second portion of the fourth data line DL4 may be connected to each other through the contact hole CNT defined in the third interlayer insulating layer 209. The second portion of the fourth data line DL4 overlaps the second portion of the second data line DL2 in the intermediate area MA as shown in FIG. 10.

Similarly, the fifth data line DL5 and the seventh data line DL7 to which data signals are applied based on the same first control signal CS-A may overlap each other in the intermediate area MA. The sixth data line DL6 and the eighth data line DL8 to which data signals are applied based on the same second control signal CS-B may overlap each other in the intermediate area MA.

Each of the seventh data line DL7 and the eighth data line DL8 includes a portion passing across the display area DA and a portion passing across the intermediate area MA (a bypass portion), and the above-described portions may be formed on different layers. A first portion of the seventh data line DL7 passing across the display area DA and a second portion of the seventh data line DL7 passing across the intermediate area MA may be connected to each other through the contact hole CNT defined in an insulating layer therebetween (e.g., the third interlayer insulating layer 209), and a first portion of the eighth data line DL8 passing across the display area DA and a second portion of the eighth data line DL8 passing across the intermediate area MA may be connected to each other through the contact hole CNT defined in an insulating layer therebetween (e.g., the third interlayer insulating layer 209).

As shown in FIG. 10, two overlapping data lines and two other overlapping data lines may be arranged to be adjacent to each other, and may be spaced apart from each other by a second distance d2 in the horizontal direction. The second distance d2 may be less than the first distance d1.

For example, a stacked structure of the overlapping first and third data lines DL1 and DL3 may be spaced apart from a stacked structure of the overlapping second and fourth data lines DL2 and DL4 with the second distance d2 in the horizontal direction (e.g., a direction parallel to an upper surface of a substrate).

The shortest distance between data lines based on different control signals may be greater than a vertical distance between data lines based on the same control signal. For example, the shortest distance between any one of the first and third data lines DL1 and DL3 and any one of the second and fourth data lines DL2 and DL4, for example, the second distance d2, a second-first distance d21, and/or a second-second distance d22, may be greater than the vertical distance d3 (hereinafter, a third distance) between the first data line D1 and the third data line D3. Similarly, the shortest distance between any one of the first and third data lines DL1 and DL3 and any one of the second and fourth data lines DL2 and DL4, for example, the second distance d2, the second-first distance d21, and/or the second-second distance d22 may be greater than the vertical distance d3 between the second data line D2 and the fourth data line D4.

The second distance d2 may be equal to or greater than about 3.0 times the third distance d3. Alternatively, the second distance d2 may be equal to or greater than about 3.5 times the third distance d3. Alternatively, the second distance d2 may be equal to or greater than about 4.0 times the third distance d3.

As described above, data lines (e.g., the first and third data lines, or the second and fourth data lines) connected to switches to be switched based on the same control signal overlap each other. In addition, by separating data lines (e.g., the first and second data lines or the first and fourth data lines, or the third and second data lines or the third and fourth data lines) respectively connected to switches to be switched based on different control signals, the degradation of display quality due to the generation of a parasitic capacitance between data lines around the first area OA may be effectively reduced.

In the display area DA, the first data line DL1 and the third data line DL3 may be spaced apart from each other with the second data line DL2 therebetween. In order to overlap the first data line DL1 and the third data line DL3 having the above structure in the intermediate area MA, a portion of the third data line DL3 may cross a portion of the second data line DL2, and the crossed portions may overlap each other. In this case, since the second data line DL2 and the third data line DL3 are connected to the switches to be switched based on different control signals, the degradation of display quality due to the aforementioned coupling may be a problem. However, since the overlap area of the second data line DL2 and the third data line DL3 is very small, the above-mentioned degradation of display quality does not actually occur.

Similar to the first data line DL1 and the third data line DL3 described above, the fifth data line DL5 and the seventh data line DL7 respectively connected to the switches to be switched based on the same control signal may overlap each other in the intermediate area MA. Since features of the fifth data line DL5 and the seventh data line DL7 are the same as those of the first data line DL1 and the third data line DL3 described above, the description is similar to the above description and will not be repeated.

Similar to the second data line DL2 and the fourth data line DL4 described above, the sixth data line DL6 and the eighth data line DL8 respectively connected to the switches to be switched based on the same control signal may overlap each other in the intermediate area MA. Since features of the sixth data line DL6 and the eighth data line DL8 are the same as those of the second data line DL2 and the fourth data line DL4 described above, the description is similar to the above description and will not be repeated.

Figure 11:
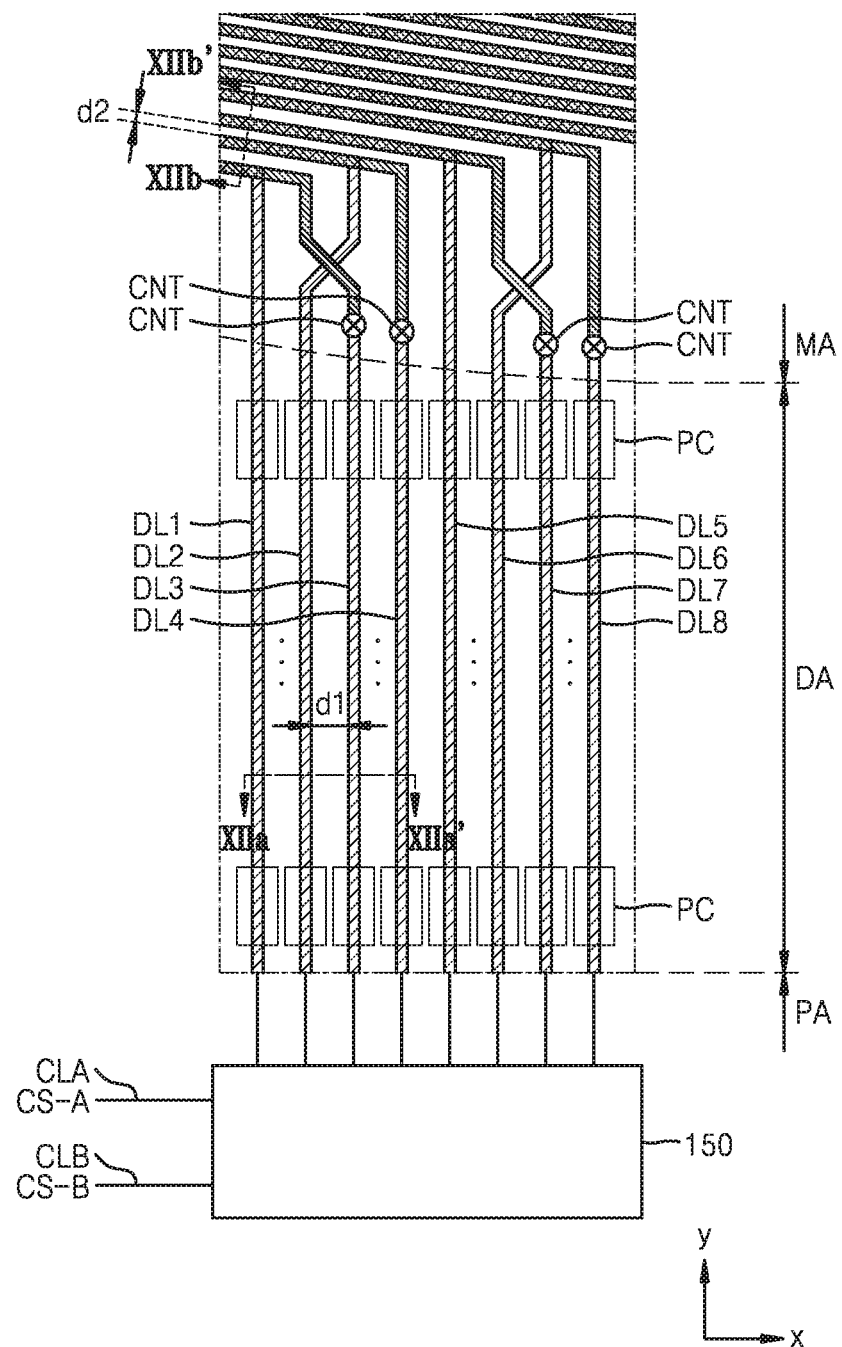
FIG. 11 is a plan view of data lines of a display panel according to an exemplary embodiment of the present invention.
Figure 12:
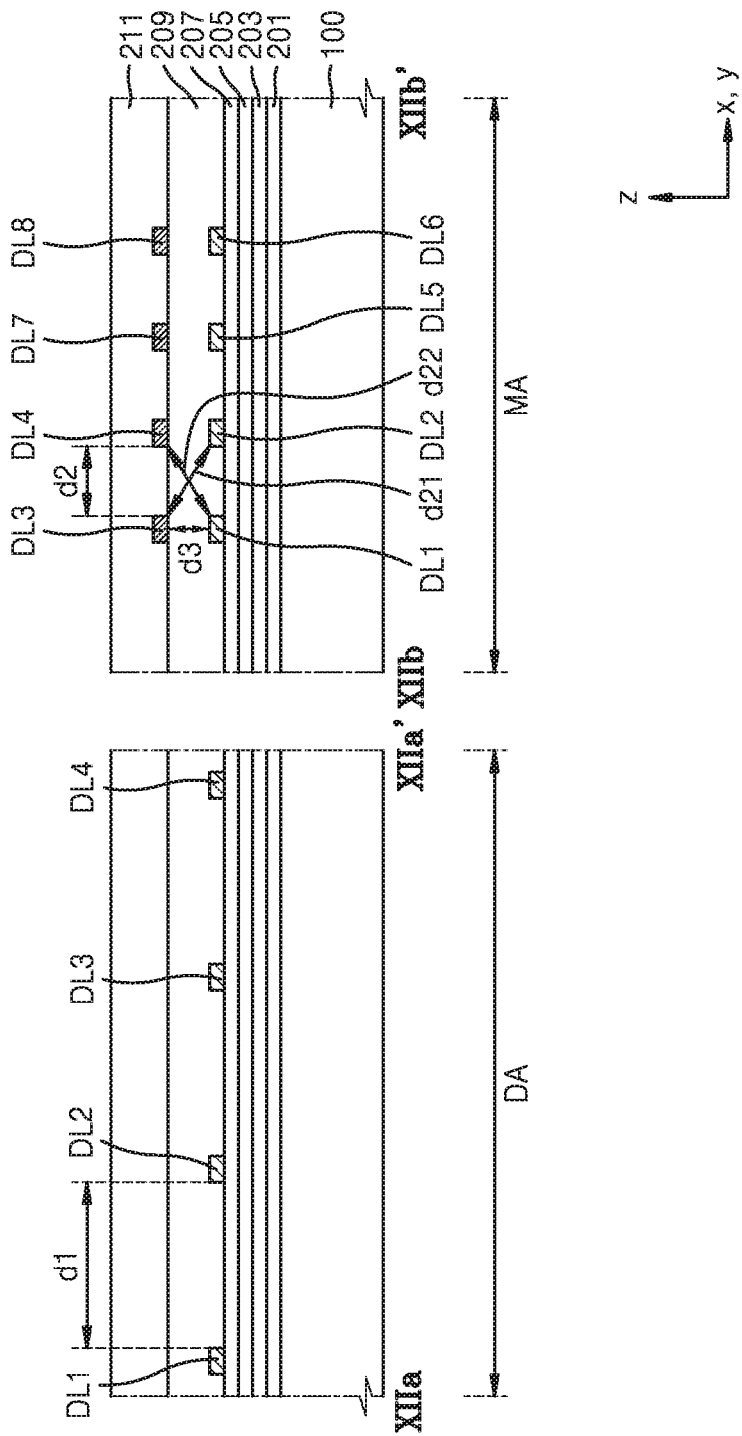
FIG. 12 is a cross-sectional view taken along lines XIIa-XIIa' and XIIb-XIIb' of FIG. 11.

FIG. 11 is a plan view of data lines of a display panel according to an exemplary embodiment, and FIG. 12 is a cross-sectional view taken along lines XIIa-XIIa' and XIIb-XIIb' of FIG. 11.

Although the data lines described above with reference to FIGS. 8 and 9, for example, the first to eighth data lines DL1, DL2, DL3, DL4, DL5, DL6, DL7, and DL8, are described as being on the third interlayer insulating layer 209 in the display area DA, as shown in FIG. 9, the inventive concepts are not limited thereto. In another exemplary embodiment, as shown in the display areas DA of FIGS. 11 and 12, portions of the first to eighth data lines DL1, DL2, DL3, DL4, DL5, DL6, DL7, and DL8 that are disposed in the display area DA may be on the same layer, for example, the second interlayer insulating layer 207, in the display area DA.

In the intermediate area MA, portions of the first data line DL1 and the third data line DL3 may overlap each other, and portions of the second data line DL2 and the fourth data line DL4 may overlap each other. Similarly, in the intermediate area MA, portions of the fifth data line DL5 and the seventh data line DL7 may overlap each other, and portions of the sixth data line DL6 and the eighth data line DL8 may overlap each other, wherein the above-described structures and features thereof are as described above with reference to FIGS. 8 and 10.

Figure 13:
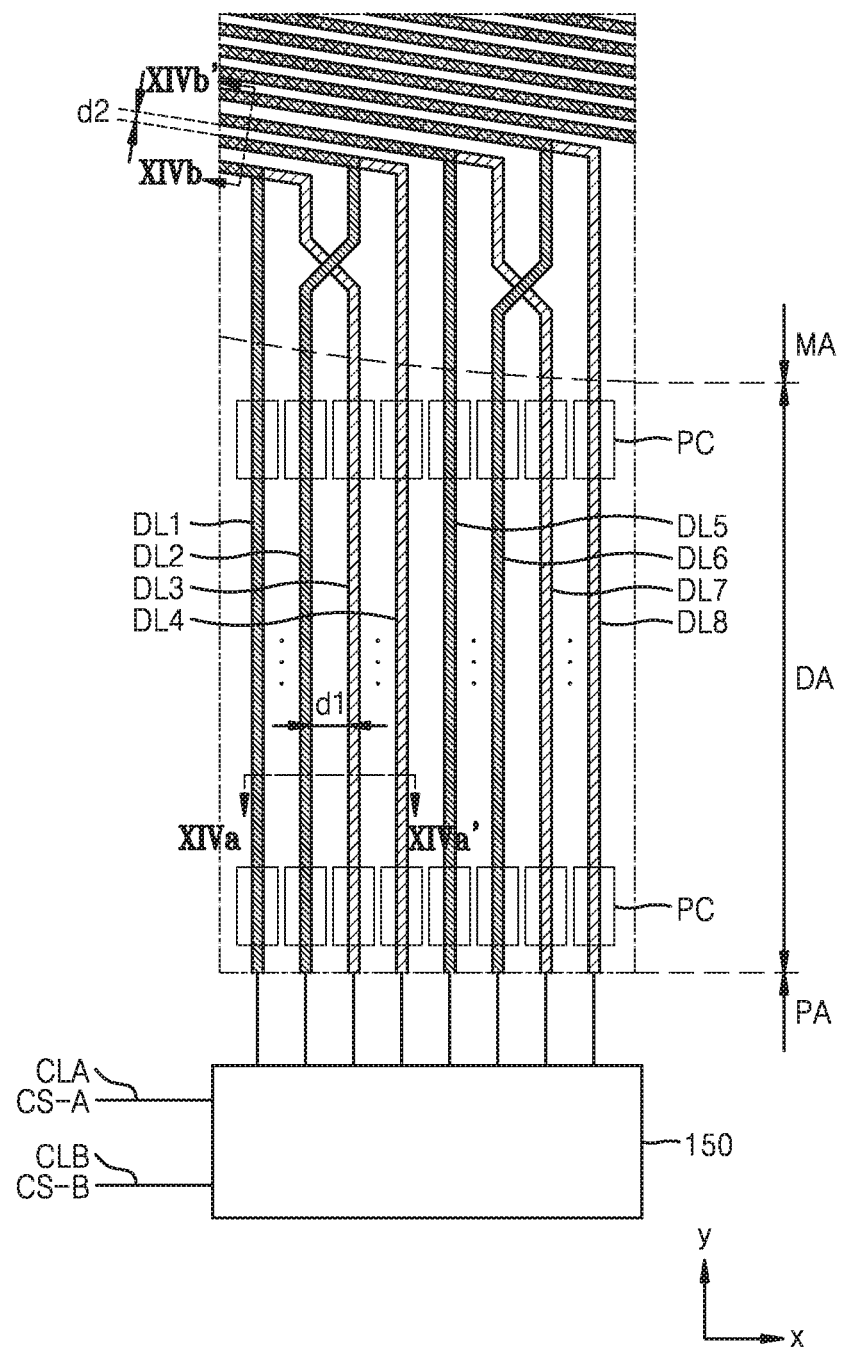
FIG. 13 is a plan view of data lines of a display panel according to an exemplary embodiment of the present invention.
Figure 14:
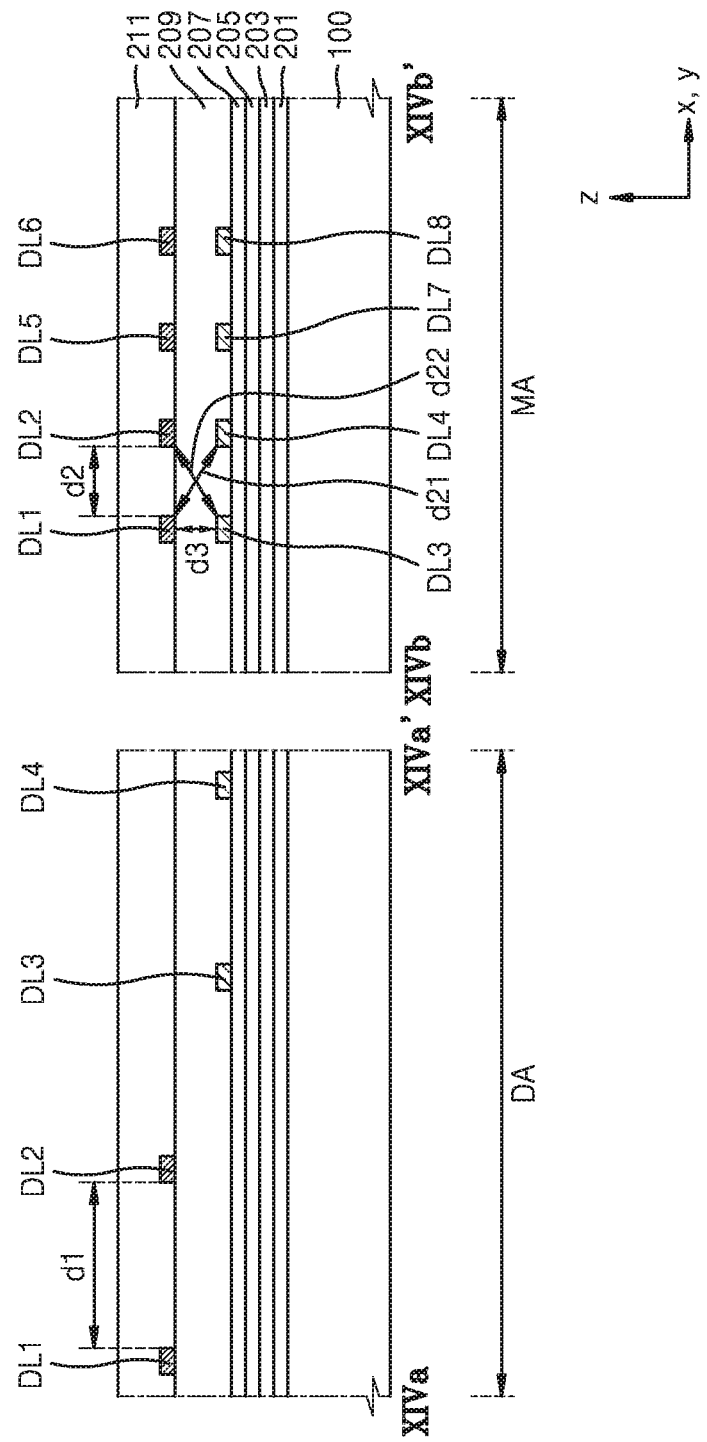
FIG. 14 is a cross-sectional view taken along lines XIVa-XIVa' and XIVb-XIVb' of FIG. 13.

FIG. 13 is a plan view of data lines of a display panel according to an embodiment, and FIG. 14 is a cross-sectional view taken along lines XIVa-XIVa' and XIVb-XIVb' of FIG. 13.

According to the exemplary embodiment described with reference to FIGS. 8 to 12, the data lines are on the same layer in the display area DA, but the inventive concepts are not limited thereto. In another exemplary embodiment, as shown in the display areas DA of FIGS. 13 and 14, portions of the first to eighth data lines DL1, DL2, DL3, DL4, DL5, DL6, DL7, and DL8 may be arranged on different layers in the display area DA.

In an exemplary embodiment, referring to FIG. 14, portions of the first data line DL1 and the second data line DL2 in the display area DA, and portions of the fifth data line DL5 and the sixth data line DL6 in the display area DA may be arranged on the third interlayer insulating layer 209. Portions of the third data line DL3 and the fourth data line DL4 in the display area DA, and portions of the seventh data line DL7 and the eighth data line DL8 in the display area DA may be arranged on the second interlayer insulating layer 207. In another exemplary embodiment, portions of the first data line DL1 and the second data line DL2, and portions of the fifth data line DL5 and the sixth data line DL6 may be arranged on the second interlayer insulating layer 207, in the display area DA. Portions of the third data line DL3 and the fourth data line DL4, and portions of the seventh data line DL7 and the eighth data line DL8 may be arranged on the third interlayer insulating layer 209, in the display area DA.

As described above, when the data lines are arranged on different layers in the display area DA, a contact hole for connecting a portion located in the display area DA to a portion located in the intermediate area MA among the data lines may not be provided separately. For example, the first data line DL1 on the third interlayer insulating layer 209 is integrally formed over the display area DA and the intermediate area MA. The third data line DL3 on the second interlayer insulating layer 207 may also be integrally formed over the display area DA and the intermediate area MA.

In the intermediate area MA, as described above, the data lines respectively connected to the switches to be switched by the same control signal may overlap each other. For example, as shown in the intermediate area MA of FIG. 14, portions of the first data line DL1 and the third data line DL3 may overlap each other and portions of the second data line DL2 and the fourth data line DL4 may overlap each other, wherein the above-described structures and features thereof are as described above.

Figure 15:
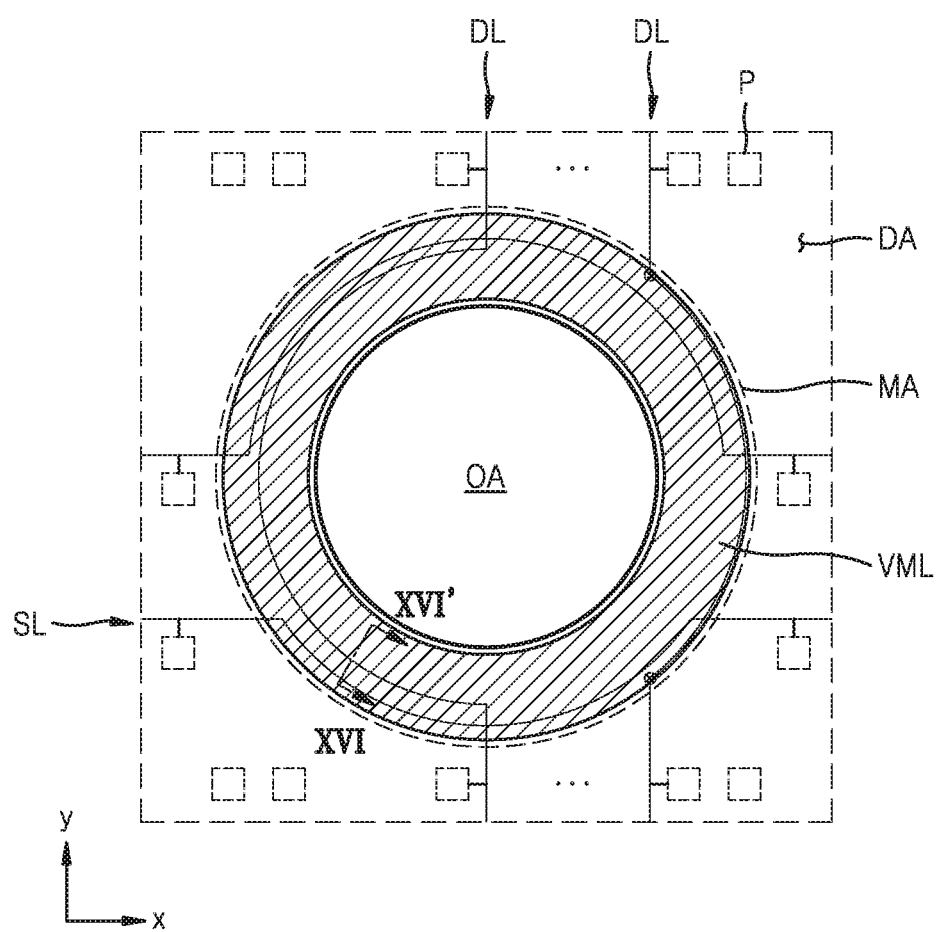
FIG. 15 is a plan view of a display panel according to an exemplary embodiment of the present invention.
Figure 16:
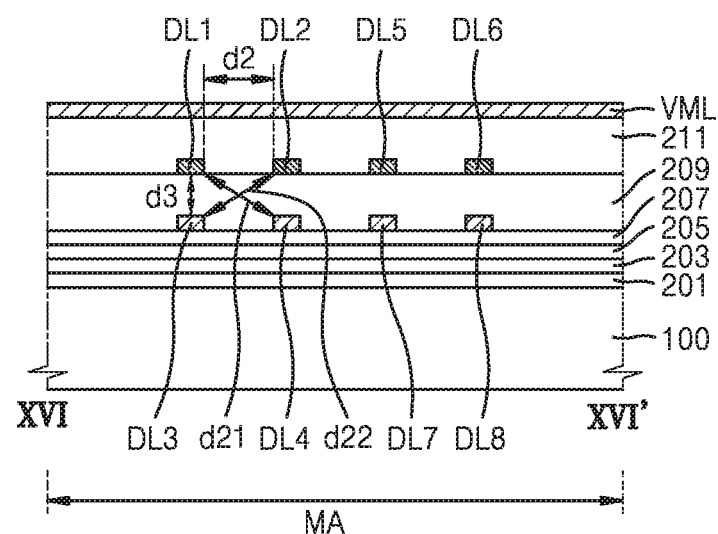
FIG. 16 is a cross-sectional view taken along line XVI-XVI' of FIG. 15.

FIG. 15 is a plan view of a display panel according to an exemplary embodiment, and FIG. 16 is a cross-sectional view taken along line XVI-XVI' of FIG. 15.

Referring to FIGS. 15 and 16, an initialization voltage layer VML may be disposed in the intermediate area MA. The initialization voltage layer VML may have a ring shape surrounding the first area OA in a plan view. The initialization voltage layer VML may be connected to the initialization voltage line VL of each pixel (of FIG. 2).

The initialization voltage layer VML may cover data lines overlapping each other in the intermediate area MA. As described above with reference to FIGS. 8 to 14, the data lines connected to the switches to be switched by the same control signal, for example, the first data line DL1 and the third data line DL3 overlap each other, and the second data line DL2 and the fourth data line DL4 overlap each other in the intermediate area MA, wherein they may be covered by the initialization voltage layer VML.

Furthermore, in the intermediate area MA, portions of the fifth data line DL5 and the seventh data line DL7 overlap each other, and portions of the sixth data line DL6 and the eighth data line DL8 overlap each other, wherein they may be covered by the initialization voltage layer VML.

The above-described structure of the initialization voltage layer VML may also be applied to the above-described exemplary embodiments; exemplary embodiments to be described later below; and exemplary embodiments derived therefrom.

Figure 17:
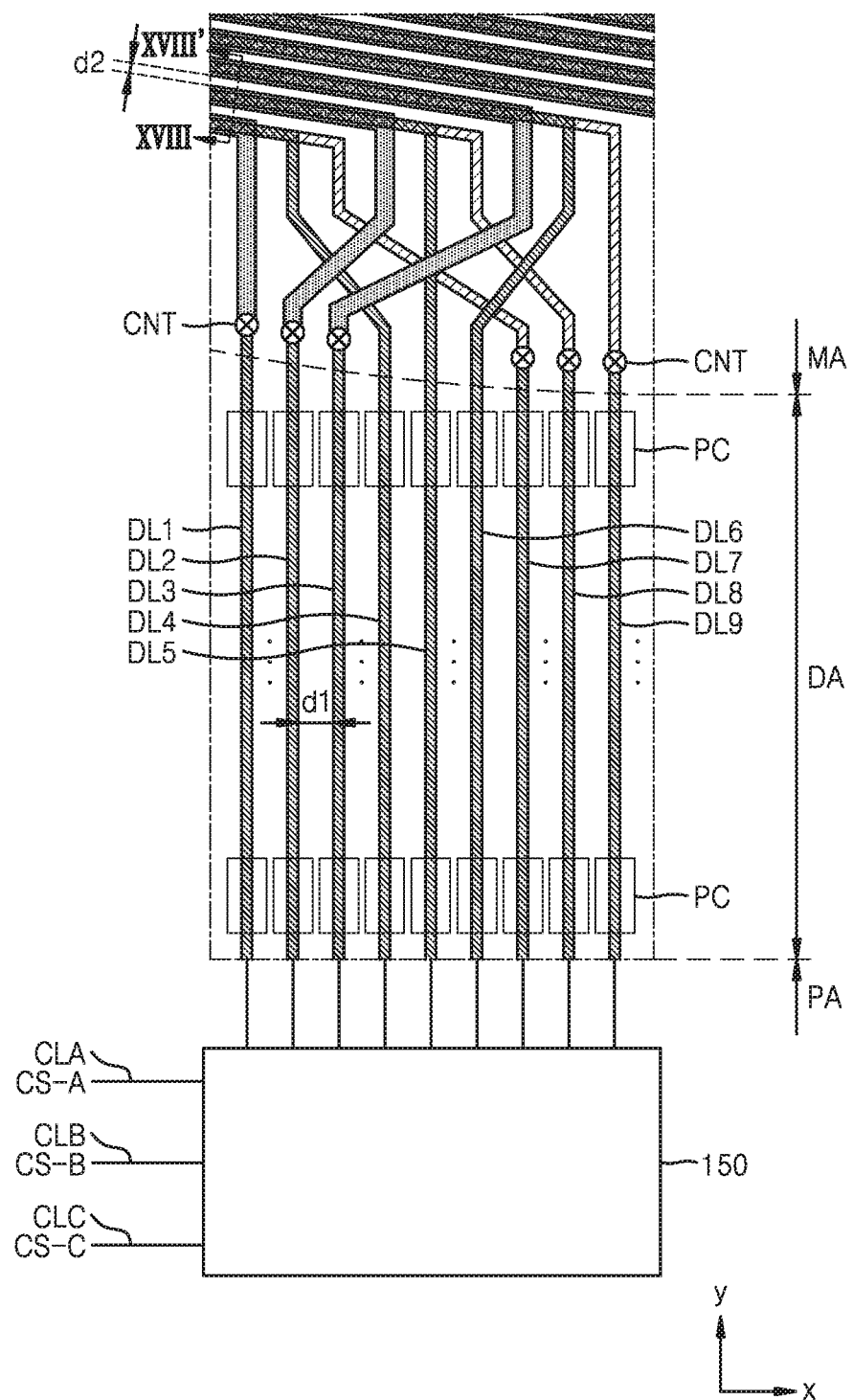
FIG. 17 is a plan view of a display panel according to an exemplary embodiment of the present invention.
Figure 18A:
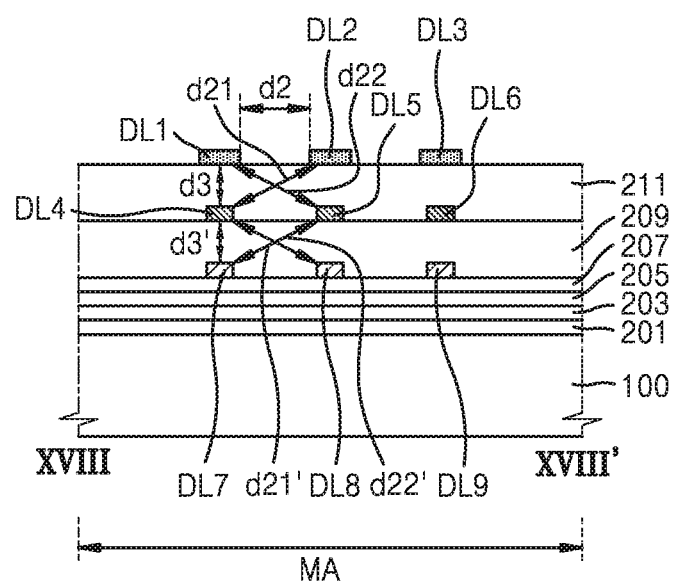
FIGS. 18A, 18B, and 18C are cross-sectional views taken along line XVIII-XVIII' of FIG. 17, respectively.
Figure 18B:
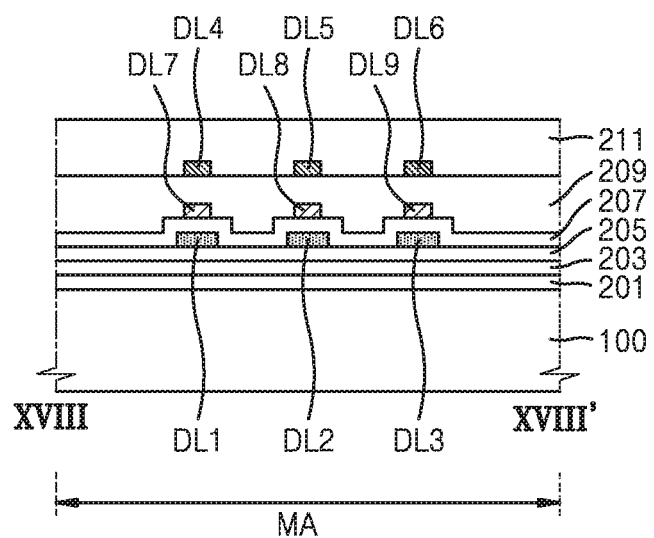
Figure 18C:
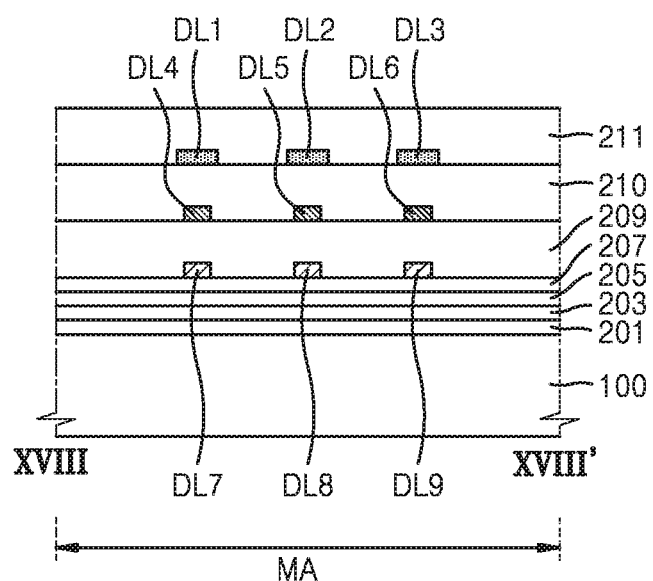

FIG. 17 is a plan view of a display panel according to an exemplary embodiment, and FIGS. 18A to 18C are cross-sectional views taken along line XVIII-XVIII' of FIG. 17, respectively.

Referring to FIG. 17, data lines extend in the y direction in the display area DA. Portions of the first to ninth data lines DL1, DL2, DL3, DL4, DL5, DL6, DL7, DL8, and DL9 that are located in the display area DA may be spaced apart from adjacent data lines by the first distance d1. In the display area DA, the portions of the first to ninth data lines DL1, DL2, DL3, DL4, DL5, DL6, DL7, DL8, and DL9 may be on the same layer.

Portions of the first to ninth data lines DL1, DL2, DL3, DL4, DL5, DL6, DL7, DL8, and DL9 that are disposed in the display area DA may be connected to the data distributor 150. The data distributor 150 includes switches respectively connected to the first demultiplexer control line CLA, the second demultiplexer control line CLB, and the third demultiplexer control line CLC. Each switch is switched by the first control signal CS-A, the second control signal CS-B, or the third control signal CS-C applied through the first demultiplexer control line CLA, the second demultiplexer control line CLB, or the third demultiplexer control line CLC, and data signals may be applied to the first to ninth data lines DL1, DL2, DL3, DL4, DL5, DL6, DL7, DL8, and DL9 by switching operations of the respective switches.

The data lines extending in the y direction in the display area DA extend in the intermediate area MA by changing their directions, and the data lines respectively connected to the switches to be switched by the same control signal may overlap each other in the intermediate area MA.

For example, the first data line DL1, the fourth data line DL4, and the seventh data line DL7, to which data signals are applied based on the first control signal CS-A, may overlap each other in the intermediate area MA. Each of a switch connected to the first data line DL1, a switch connected to the fourth data line DL4, and a switch connected to the seventh data line DL7 may be connected to the first demultiplexer control line CLA to receive the aforementioned first control signal CS-A.

The second data line DL2, the fifth data line DL5, and the eighth data line DL8, to which data signals are applied based on the second control signal CS-B, may overlap each other in the intermediate area MA. Each of a switch connected to the second data line DL2, a switch connected to the fifth data line DL5, and a switch connected to the eighth data line DL8 may be connected to the second demultiplexer control line CLB to receive the aforementioned second control signal CS-B.

The third data line DL3, the sixth data line DL6, and the ninth data line DL9, to which data signals are applied based on the third control signal CS-C, may overlap each other in the intermediate area MA. Each of a switch connected to the third data line DL3, a switch connected to the sixth data line DL6, and a switch connected to the ninth data line DL9 may be connected to the third demultiplexer control line CLC to receive the aforementioned third control signal CS-C.

As shown in FIG. 18A, in the intermediate area MA, portions of the first data line DL1, the fourth data line DL4, and the seventh data line DL7 may overlap each other in the vertical direction with an insulating layer therebetween. Similarly, in the intermediate area MA, portions of the second data line DL2, the fifth data line DL5, and the eighth data line DL8 may overlap each other in the vertical direction with an insulating layer therebetween. In the intermediate area MA, portions of the third data line DL3, the sixth data line DL6, and the ninth data line DL9 may also overlap each other in the vertical direction with an insulating layer therebetween.

An overlapping structure of the first data line DL1, the fourth data line DL4, and the seventh data line DL7, an overlapping structure of the second data line DL2, the fifth data line DL5, and the eighth data line DL8, and an overlapping structure of the third data line DL3, the sixth data line DL6, and the ninth data line DL9 may be spaced apart from each other by the second distance d2 in the horizontal direction.

A shortest distance between data lines based on different control signals may be greater than a vertical distance between data lines based on the same control signal. For example, the shortest distance between any one of the first, fourth, and seventh data lines DL1, DL4, and DL7 and any one of the second, fifth, and eighth data lines DL2, DL5, and DL8, for example, the second distance d2, second-first distances d21 and d21', and second-second distances d22 and d22' may be greater than vertical distances (hereinafter, third distances, d3 and d3') between the overlapping data lines.

FIG. 18A shows that portions of the first data line DL1, the fourth data line DL4, and the seventh data line DL7 corresponding to the intermediate area MA are located on the planarization insulating layer 211, the third interlayer insulating layer 209, and the second interlayer insulating layer 207, respectively, but the inventive concepts are not limited thereto. In another exemplary embodiment, as shown in FIG. 18B, the portions of the first data line DL1, the fourth data line DL4, and the seventh data line DL7 corresponding to the intermediate area MA may be arranged on the first interlayer insulating layer 205, the third interlayer insulating layer 209, and the second interlayer insulating layer 207, respectively. Alternatively, as shown in FIG. 18C, the portions of the first data line DL1, the fourth data line DL4, and the seventh data line DL7 corresponding to the intermediate area MA may be arranged on a fourth interlayer insulating layer 210, the third interlayer insulating layer 209, and the second interlayer insulating layer 207, respectively.

In an exemplary embodiment, FIG. 17 shows that portions of the first to ninth data lines DL1, DL2, DL3, DL4, DL5, DL6, DL7, DL8, and DL9 located in the display area DA are disposed on the same layer, for example, the third interlayer insulating layer 209. A portion passing across the intermediate area MA and a portion passing across the display area DA of each of the fourth to sixth data lines DL4, DL5, and DL6 may be integrally formed. The portion passing across the intermediate area MA and the portion passing across the display area DA of each of the first to third data lines DL1, DL2, and DL3 may be connected to each other through the contact hole CNT defined in at least one insulating layer therebetween. Similarly, the portion passing across the intermediate area MA and the portion passing across the display area DA of each of the seventh to ninth data lines DL7, DL8, and DL9 may be connected to each other through the contact hole CNT defined in at least one insulating layer therebetween.

FIG. 17 illustrates a case in which portions of the first to ninth data lines DL1, DL2, DL3, DL4, DL5, DL6, DL7, DL8, and DL9 passing across the display area DA are located on the same layer and disposed on the third interlayer insulating layer 209, but the inventive concepts are not limited thereto. In another exemplary embodiment, the portions of the first to ninth data lines DL1, DL2, DL3, DL4, DL5, DL6, DL7, DL8, and DL9 passing across the display area DA are located on the same layer, wherein the same layer described above may be the second interlayer insulating layer 207 or the fourth interlayer insulating layer 210.

In another exemplary embodiment, the portions of the first to ninth data lines DL1, DL2, DL3, DL4, DL5, DL6, DL7, DL8, and DL9 located in the display area DA may be on different layers as described above with reference to FIG. 13. In this case, a portion located in the display area DA and a portion located in the intermediate area MA of each of the first to ninth data lines DL1, DL2, DL3, DL4, DL5, DL6, DL7, DL8, DL9 may be integrally formed, and thus, may not include a separate contact hole CNT.

Figure 19:
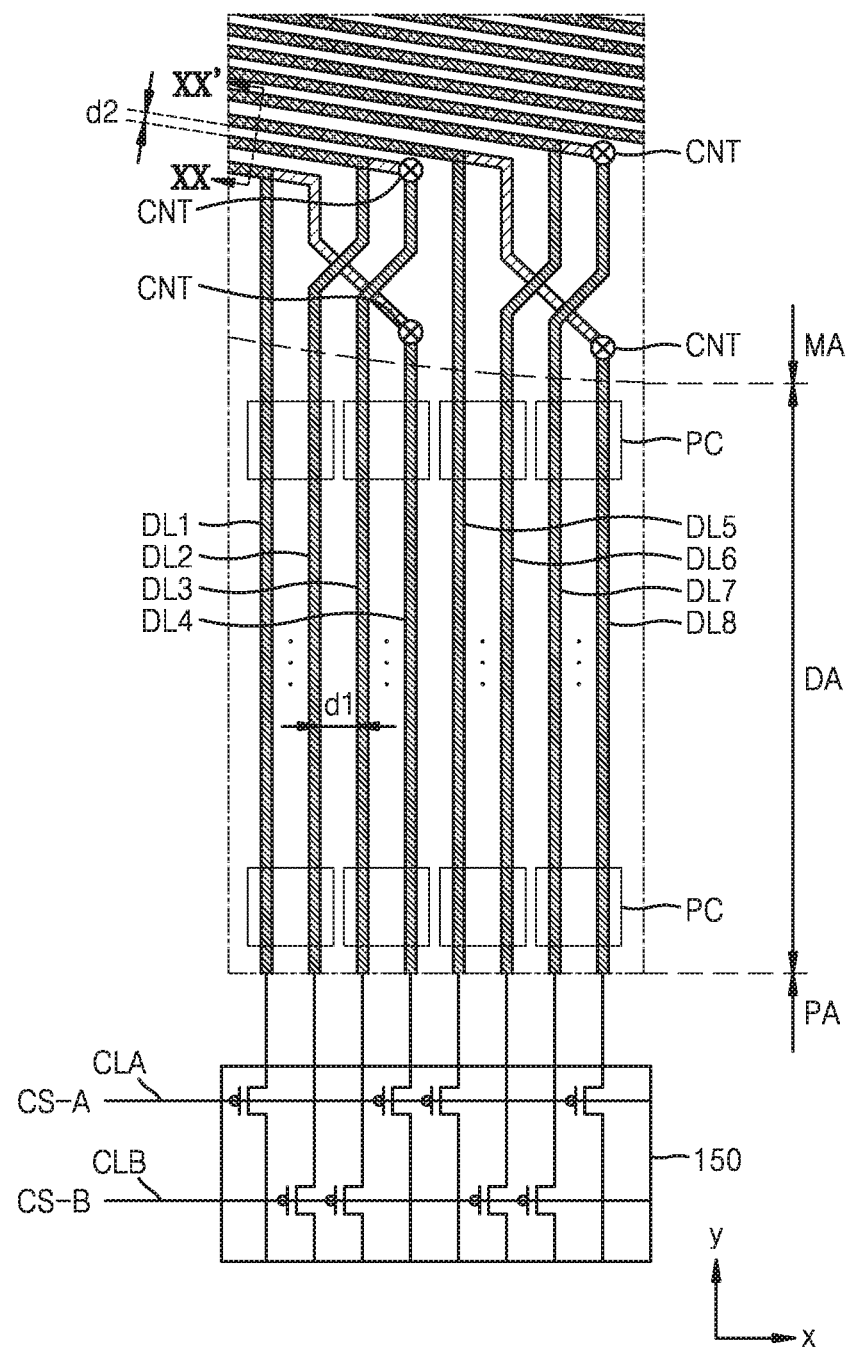
FIG. 19 is a plan view of data lines of a display panel according to an exemplary embodiment of the present invention.
Figure 20:
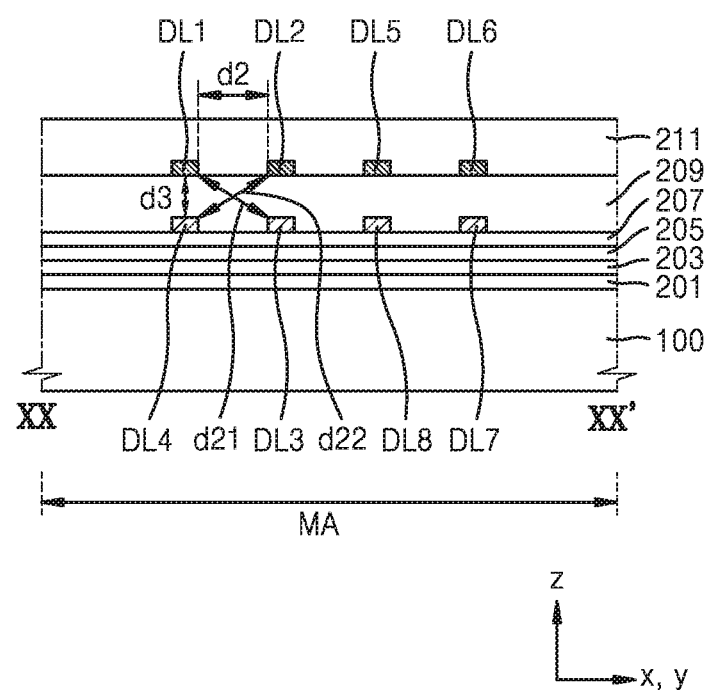
FIG. 20 is a cross-sectional view taken along line XX-XX' of FIG. 19.

FIG. 19 is a plan view of data lines of a display panel according to an embodiment, and FIG. 20 is a cross-sectional view taken along line XX-XX' of FIG. 19.

Referring to FIG. 19, in the display area DA, the pixel circuits PC respectively corresponding to pixels may be arranged in a row direction (x direction) and a column direction (y direction). Two adjacent data lines may pass through one pixel circuit PC, but a data signal applied to one pixel circuit PC may be provided through one of the two data lines.

Data lines, for example, the first to eighth data lines DL1, DL2, DL3, DL4, DL5, DL6, DL7, and DL8, extend in the y direction in the display area DA. Portions of the first to eighth data lines DL1, DL2, DL3, DL4, DL5, DL6, DL7, and DL8 located in the display area DA may be arranged on the same layer as described above with reference to FIGS. 8 and 9, for example, the third interlayer insulating layer 209.

As described above with reference to FIG. 5, the data lines are electrically connected to the data driving circuit 120, and the data distributor 150 may be located between the data lines and the data driving circuit 120. The data distributor 150 includes switches respectively connected to the first demultiplexer control line CLA and the second demultiplexer control line CLB. Each switch is switched by the first demultiplexer control line CLA or the second demultiplexer control line CLB, and data signals may be applied to the first to eighth data lines DL1, DL2, DL3, DL4, DL5, DL6, DL7, and DL8 by switching operations of the respective switches.

In an exemplary embodiment, the first demultiplexer control line CLA may be connected to switches for applying data signals to pixels (or pixel circuits PCs) arranged in a $2k-1^{th}$ row direction (k is a natural number of 1 or more), and the second demultiplexer control line CLB may be connected to switches for applying data signals to pixels (or pixel circuits PCs) arranged in a $2k^{th}$ row direction.

The data lines extending in the y direction in the display area DA may extend to bypass the first area OA (of FIG. 7) in the intermediate area MA, and the data lines may overlap each other in the intermediate area MA.

For example, the first data line DL1 and the fourth data line DL4 extending in the y direction while being spaced apart from each other in the display area DA may overlap each other in the intermediate area MA. In other words, a first portion of the first data line DL1 corresponding to the display area DA and a first portion of the fourth data line DL4 corresponding to the display area DA are spaced apart from each other at a certain interval without overlapping. However, a second portion (bypass portion) of the first data line DL1 corresponding to the intermediate area MA and a second portion (bypass portion) of the fourth data line DL4 corresponding to the intermediate area MA may overlap each other. The first data line DL1 and the fourth data line DL4 are connected to switches to be switched based on the same control signal, respectively. The respective switches connected to the first data line DL1 and the fourth data line DL4 are turned on based on the first control signal CS-A applied through the first demultiplexer control line CLA and may provide data signals to the first data line DL1 and the fourth data line DL4.

While the first portion of the first data line DL1 located in the display area DA is integrally formed with a second portion of the first data line DL1 located in the intermediate area MA, the first portion of the fourth data line DL4 located in the display area DA is arranged on a different layer from the second portion of the fourth data line DL4 located in the intermediate area MA. The first portion of the fourth data line DL4 may be connected to the second portion of the fourth data line DL4 through the contact hole CNT formed in at least one insulating layer therebetween.

The second data line DL2 and the third data line DL3 extending in the y direction while being apart from each other in the display area DA may overlap each other in the intermediate area MA. In other words, a first portion of the second data line DL2 corresponding to the display area DA and a first portion of the third data line DL3 corresponding to the display area DA are apart from each other at a certain interval without overlapping. However, a second portion (bypass portion) of the second data line DL2 corresponding to the intermediate area MA and a second portion (bypass portion) of the third data line DL3 corresponding to the intermediate area MA may overlap each other. The second data line DL2 and the third data line DL3 are connected to switches to be switched based on the same control signal, respectively. The respective switches connected to the second data line DL2 and the third data line DL3 are turned on based on the second control signal CS-B applied through the second demultiplexer control line CLB and may provide data signals to the second data line DL2 and the third data line DL3.

While the first portion of the second data line DL2 located in the display area DA and a second portion of the second data line DL2 in the intermediate area MA are disposed on a same layer, the first portion of the third data line DL3 located in the display area DA is arranged on a different layer from the second portion of the third data line DL3 located in the intermediate area MA. The first portion of the second data line DL2 may be connected to the second portion of the second data line DL2 by a medium portion between the first and second portions. The first portion of the third data line DL3 may be connected to the second portion of the third data line DL3 through the contact hole CNT formed in at least one insulating layer therebetween.

In order to reduce the area of the intermediate area MA, for example, the area of a dead area not displaying an image, a distance in a horizontal direction between adjacent data lines in the intermediate area MA (the second distance, d2) may be less than a distance in a horizontal direction between adjacent data lines in the display area DA (the first distance, d1). When coupling occurs between data lines arranged at relatively narrow intervals, for example, between bypass portions of data lines arranged in the intermediate area MA, the quality of an image provided in the display area DA may be degraded. However, according to exemplary embodiments, the occurrence of the aforementioned coupling may be reduced by overlapping data lines, to which data signals are applied, in the intermediate area MA according to switching operations of switches operating based on the substantially same control signal among control signals applied to the data distributor 150.

Referring to the cross-sectional view of FIG. 20, the shortest distance between data lines based on different control signals may be greater than the vertical distance between data lines based on the same control signal. For example, the shortest distance between any one of the first and fourth data lines DL1 and DL4 and any one of the second and third data lines DL2 and DL3, for example, the second distance d2, the second-first distance d21, and the second-second distance d22 may be greater than the vertical distance d3 (third distance) between the first data line D1 and the fourth data line D4.

As shown in FIG. 19, in a plan view, the first data line DL1 and the fourth data line DL4, in the display area DA, may be spaced apart from each other with the second data line DL2 and the third data line DL3 therebetween. In order to overlap the first data line DL1 and the fourth data line DL4 having the above structure in the intermediate area MA, a portion of the fourth data line DL4 may cross portions of the second data line DL2 and the third data line DL3, and the crossed portions may overlap each other. Since the fourth data line DL4 is connected to switches to be switched based on a control signal different from control signals on which the second and third data lines DL2 and DL3 are based, the degradation of display quality due to the aforementioned coupling may be a problem. However, since the overlap area of the fourth data line DL4 and the second and third data lines DL2 and DL3 is very small, the above-mentioned degradation of display quality does not actually occur.

FIGS. 19 and 20 describe that portions of the data lines corresponding to the display area DA are on the third interlayer insulating layer 209, but the inventive concepts are not limited thereto. As described above with reference to FIGS. 11 and 12, the portions of the data lines corresponding to the display area DA may be on the second interlayer insulating layer 207.

FIG. 19 describes that the portions of the data lines corresponding to the display area DA are on the same layer, but the inventive concepts are not limited thereto. As described above with reference to FIGS. 13 and 14, the portions of the data lines corresponding to the display area DA may be arranged on different layers.

Although FIG. 20 shows arrangement of data lines, the inventive concepts are not limited thereto. In other exemplary embodiments, the structure of the initialization voltage layer VML described with reference to FIGS. 15 and 16 may also be applied to the exemplary embodiment described with reference to FIG. 20.

Figure 21:
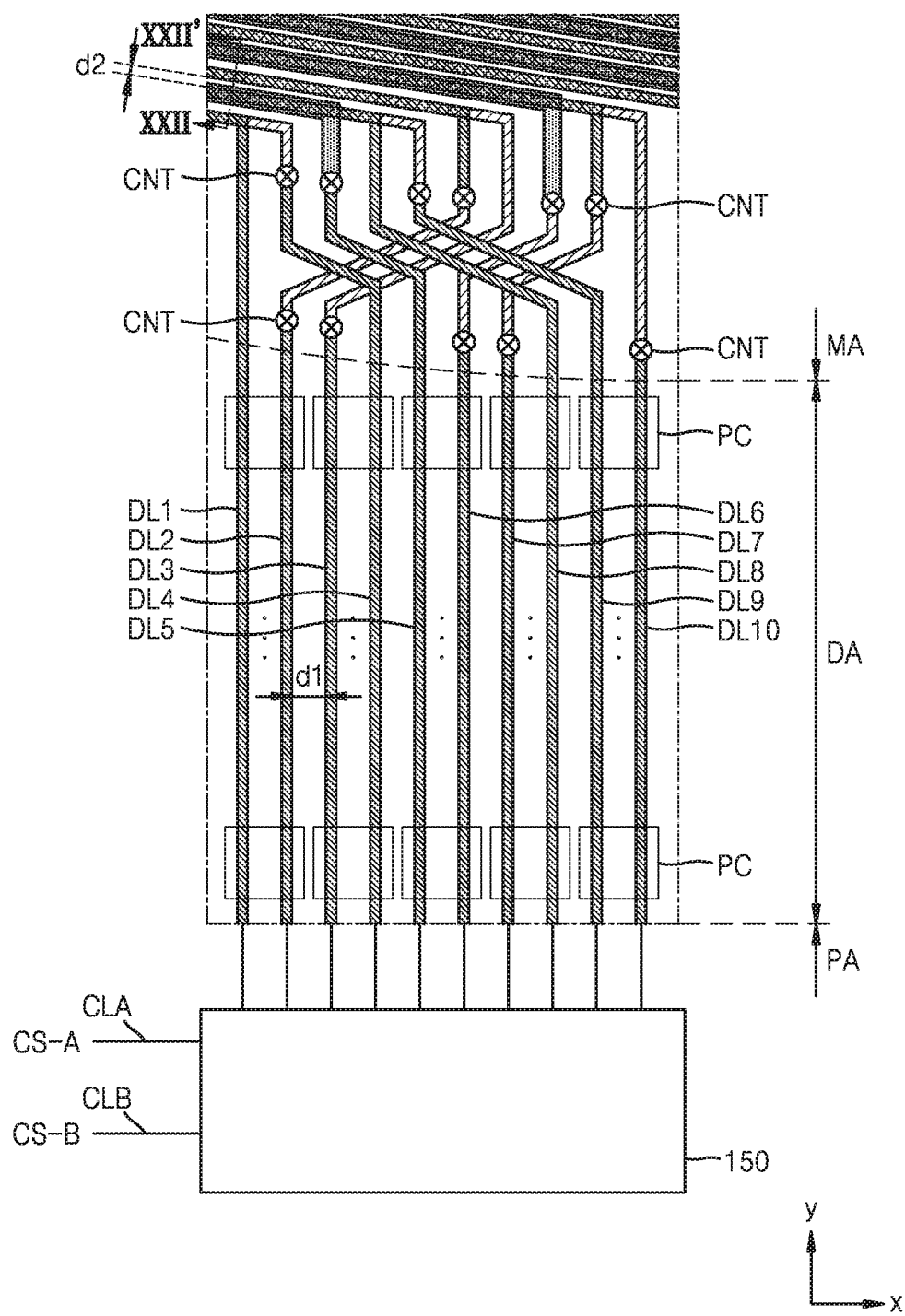
FIG. 21 is a plan view of data lines of a display panel according to an exemplary embodiment of the present invention.
Figure 22:
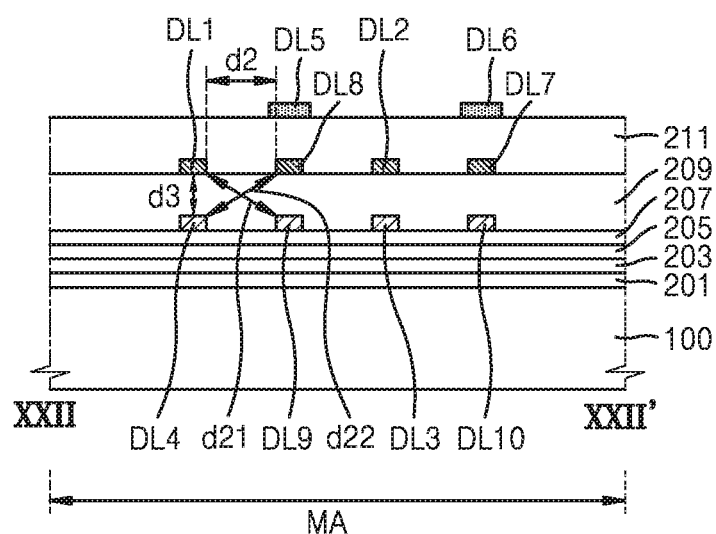
FIG. 22 is a cross-sectional view taken along line XXII-XXII' of FIG. 21.

FIG. 21 is a plan view of data lines of a display panel according to an exemplary embodiment, and FIG. 22 is a cross-sectional view taken along line XXII-XXII' of FIG. 21.

In the exemplary embodiment described with reference to FIG. 19, two data lines overlap in the intermediate area MA. However, referring to FIG. 21, two or three data lines may overlap in the intermediate area MA. Hereinafter, features according to the exemplary embodiment of FIG. 21 will be described based on differences from FIG. 19.

As shown in FIGS. 21 and 22, two or three data lines may overlap each other in the intermediate area MA, and the data lines overlapping each other may be connected to switches to be switched by the same control signal.

For example, portions of the first data line DL1 and the fourth data line DL4 may overlap each other in the intermediate area MA. Similarly, portions of the fifth data line DL5, the eighth data line DL8, and the ninth data line DL9 may overlap each other in the intermediate area MA, and portions of the second data line DL2 and the third data line DL3 may overlap each other in the intermediate area MA. Portions of the sixth data line DL6, the seventh data line DL7, and a tenth data line DL10 may overlap each other in the intermediate area MA. The above-described overlapping structure and related features are as described above.

Although FIG. 22 describes that the data lines overlapping each other in the intermediate area MA are on the second interlayer insulating layer 207, the third interlayer insulating layer 209, and the planarization insulating layer 211, respectively, the inventive concepts are not limited thereto. In other exemplary embodiments, as described above with reference to FIG. 18B or 18C, positions of the data lines may vary. That is, an insulating layer under each of the data lines may be any one of the first to fourth interlayer insulating layers 205, 207, 209, and 210.

FIGS. 23A to 23D are cross-sectional views of a display panel according to an exemplary embodiment.

Figure 23A:
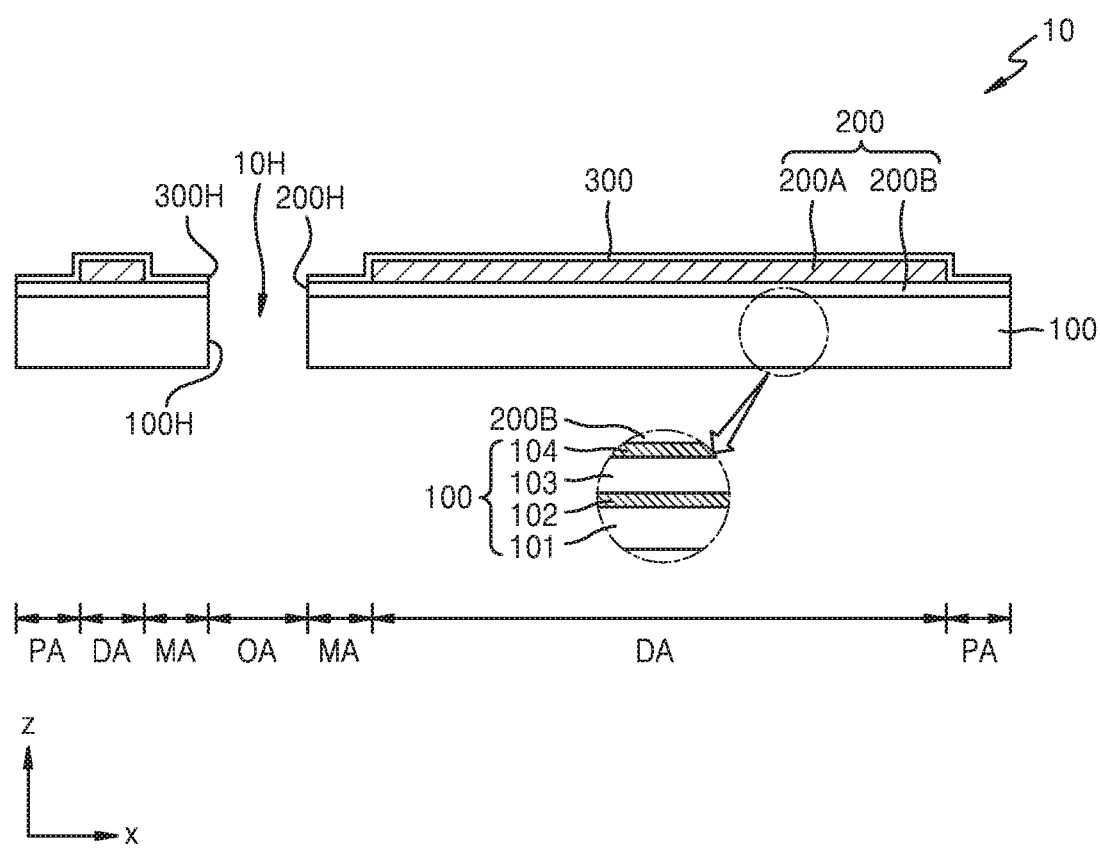
FIGS. 23A, 23B, 23C, and 23D are cross-sectional views of a display panel according to an exemplary embodiment of the present invention.

Referring to FIG. 23A, the display panel 10 includes the display layer 200 disposed on the substrate 100. The display layer 200 may include layers between the substrate 100 and the thin film encapsulation layer 300 described above with reference to FIG. 6.

The substrate 100 may include a glass material or a polymer resin. When the substrate 100 includes a polymer resin, the substrate 100 may be formed in multiple layers. For example, as shown in the enlarged view of FIG. 23A, the substrate 100 may include a first base layer 101, a first barrier layer 102, a second base layer 103, and a second barrier layer 104.

Each of the first base layer 101 and the second base layer 103 may include a polymer resin. For example, the first base layer 101 and the second base layer 103 may include a polymer resin, such as polyethersulfone (PES), polyarylate (PAR), polyetherimide (PEI), polyethylen naphthalate (PEN), polyethyeleneterepthalate (PET), polyphenylene sulfide (PPS), polyimide (PI), polycarbonate (PC), cellulose triacetate (TAC), cellulose acetate propionate (CAP), and the like.

Each of the first and second barrier layers 102 and 104 is a barrier layer for preventing penetration of external foreign matter and may include a single layer or multiple layers including an inorganic material, such as silicon nitride and/or silicon oxide.

The display layer 200 includes a plurality of pixels. The display layer 200 may include a display element layer 200A including display elements arranged for each pixel, and a pixel circuit layer 200B including a pixel circuit and insulating layers arranged for each pixel. Each pixel circuit may include a transistor and a storage capacitor, and each display element may include an organic light-emitting diode (OLED).

The display elements of the display layer 200 may be covered by an encapsulation member, such as the thin film encapsulation layer 300, and the thin film encapsulation layer 300 may include at least one inorganic encapsulation layer and at least one organic encapsulation layer. When the display panel 10 includes the substrate 100 including a polymer resin and the thin film encapsulation layer 300 including the inorganic encapsulation layer and the organic encapsulation layer, flexibility of the display panel 10 may be improved.

The display panel 10 may include a first opening 10H penetrating the display panel 10. The first opening 10H may be located in the first area OA, in which case the first area OA may be a kind of opening area. FIG. 23A shows that the substrate 100 and the thin film encapsulation layer 300 include through-holes 100H and 300H corresponding to the first opening 10H of the display panel 10, respectively. The display layer 200 may also include a through-hole 200H corresponding to the first area OA.

Figure 23B:
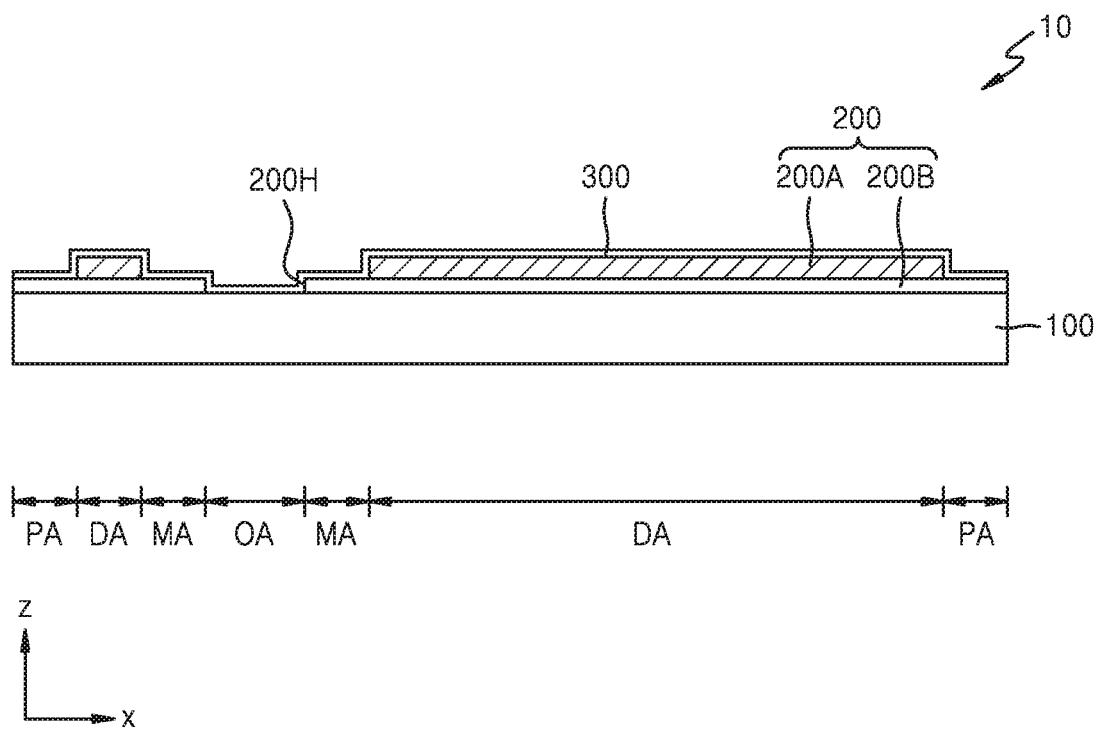

In another exemplary embodiment, as shown in FIG. 23B, the substrate 100 may not include a through-hole corresponding to the first area OA. The display layer 200 may also include the through-hole 200H corresponding to the first area OA. The thin film encapsulation layer 300 may not include a through-hole corresponding to the first area OA. In another exemplary embodiment, as shown in FIG. 23C, the display layer 200 may not include the through-hole 200H corresponding to the first area OA, and the display element layer 200A is not located in the first area OA.

Figure 23C:
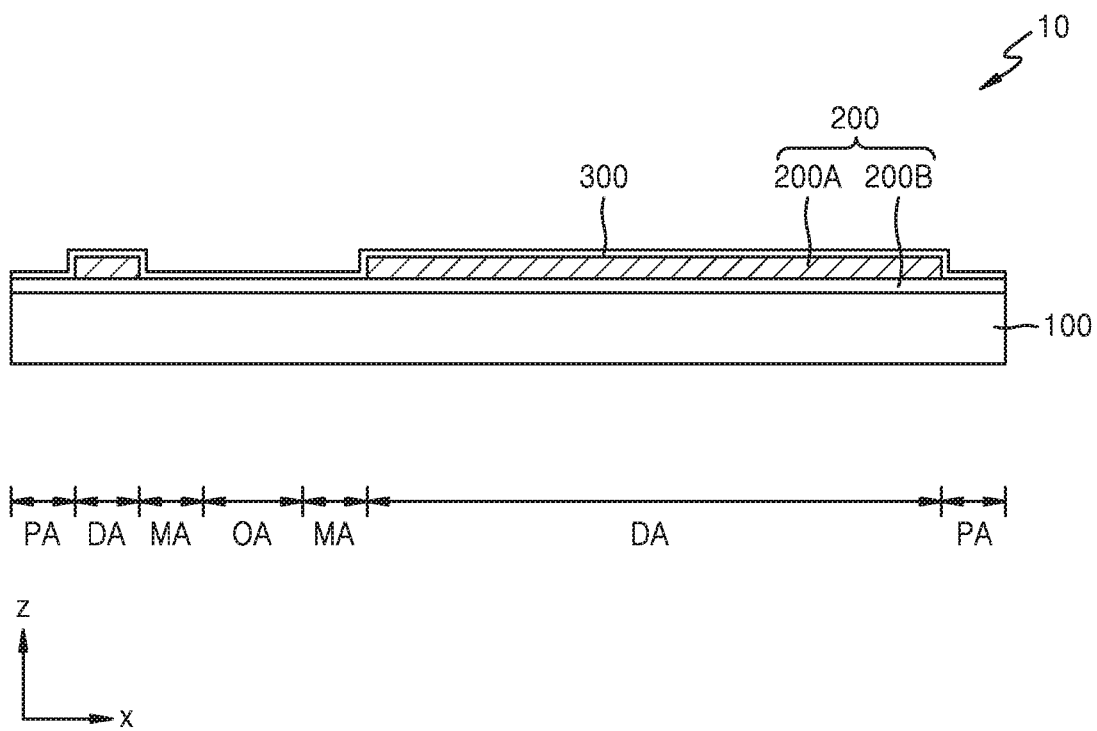
Figure 23D:
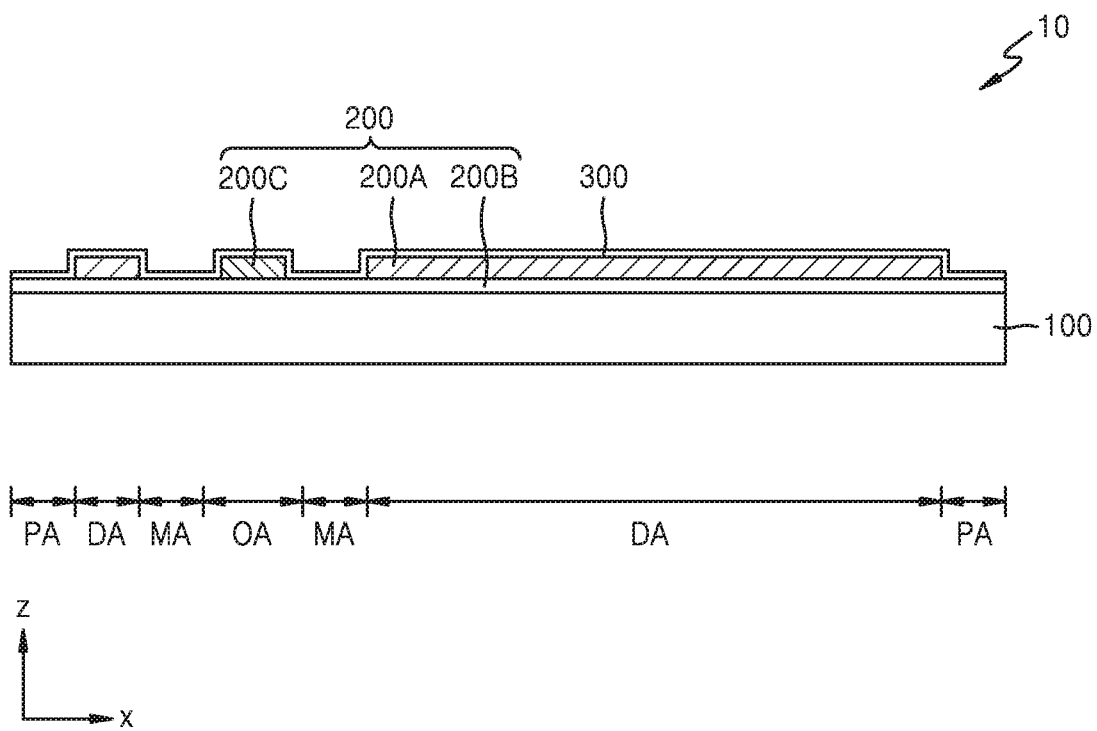

FIGS. 23A to 23C show that the display element layer 200A is not disposed in the first area OA, but the inventive concepts are not limited thereto. In another exemplary embodiment, as shown in FIG. 23D, an auxiliary display element layer 200C may be located in the first area OA. The auxiliary display element layer 200C may include a display element that operates in a different structure and/or in a different manner from the display element of the display element layer 200A.

In an exemplary embodiment, each pixel of the display element layer 200A may include an active type organic light-emitting diode, and the auxiliary display element layer 200C may include pixels including passive type organic light-emitting diodes, respectively. When the auxiliary display element layer 200C includes a display element of a passive organic light-emitting diode, elements that constitute a pixel circuit may not exist under the passive organic light-emitting diode. For example, a portion of the pixel circuit layer 200B below the auxiliary display element layer 200C does not include a transistor and a storage capacitor.

In another exemplary embodiment, the auxiliary display element layer 200C may include display elements of the same type (e.g., an active type organic light-emitting diode) as the display element layer 200A, but may have a different structure of the pixel circuit thereunder. For example, the pixel circuit under the auxiliary display element layer 200C may include a structure (e.g., a pixel circuit having a light shielding film between a substrate and a transistor) different from that of the pixel circuit under the display element layer 200A. Alternatively, the display elements of the auxiliary display element layer 200C may operate according to control signals different from those of the display elements of the display element layer 200A. A component (e.g., an infrared sensor, etc.) that does not require relatively high transmittance may be disposed in the first area OA in which the auxiliary display element layer 200C is disposed. In this case, the first area OA may be a component area and an auxiliary display area.

FIGS. 24A to 24D are cross-sectional views of a display panel according to an exemplary embodiment. Unlike the display panel 10 described with reference to FIGS. 23A to 23D including the thin film encapsulation layer 300, a display panel 10' of FIGS. 24A to 24D may include an encapsulation substrate 300A and a sealant 340.

Figure 24A:
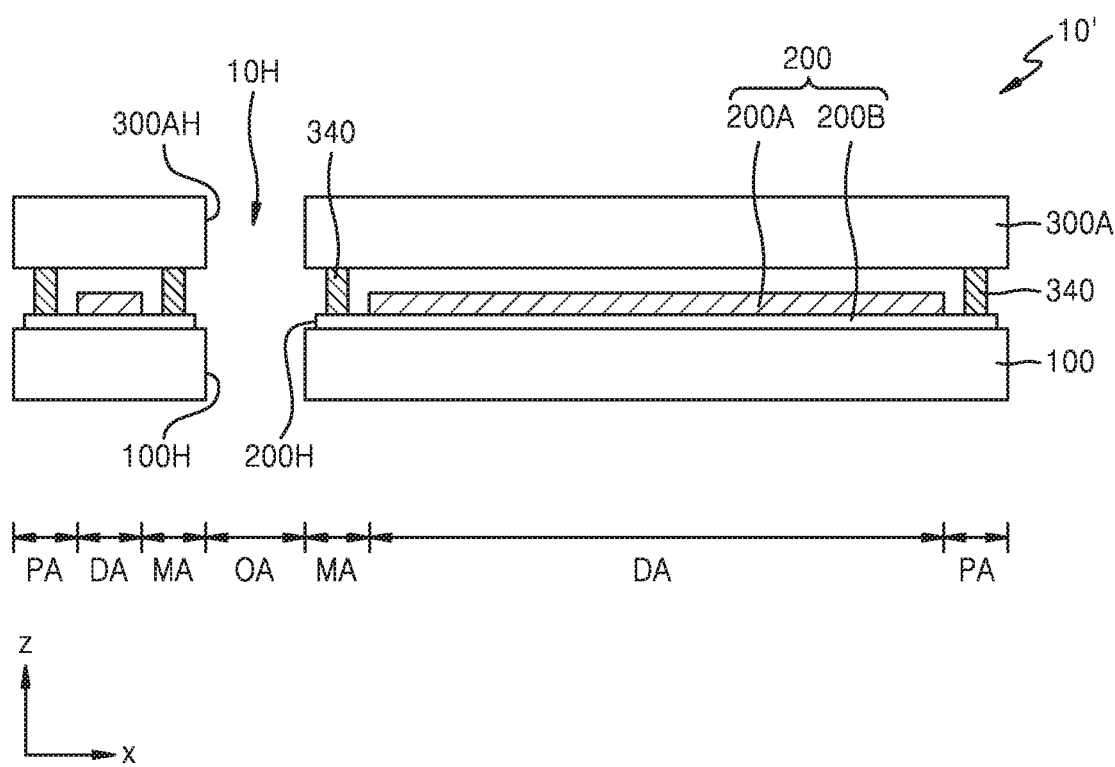
FIGS. 24A, 24B, 24C, and 24D are cross-sectional views of a display panel according to an exemplary embodiment of the present invention.
Figure 24B:
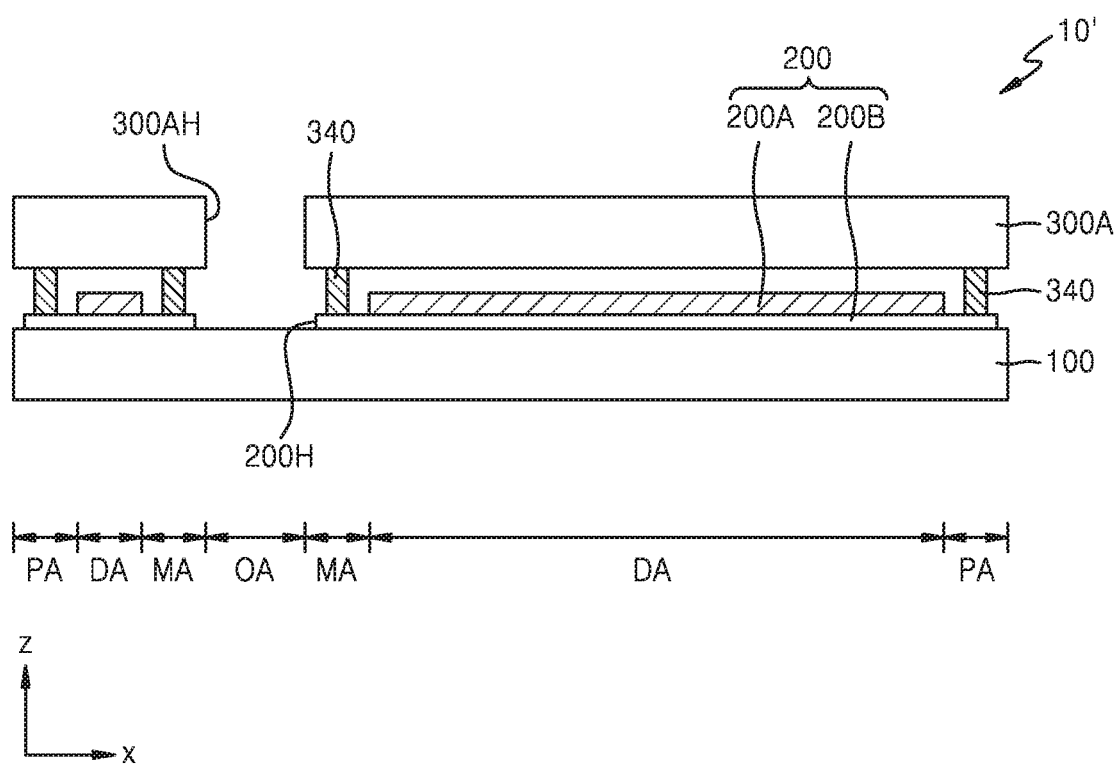
Figure 24C:
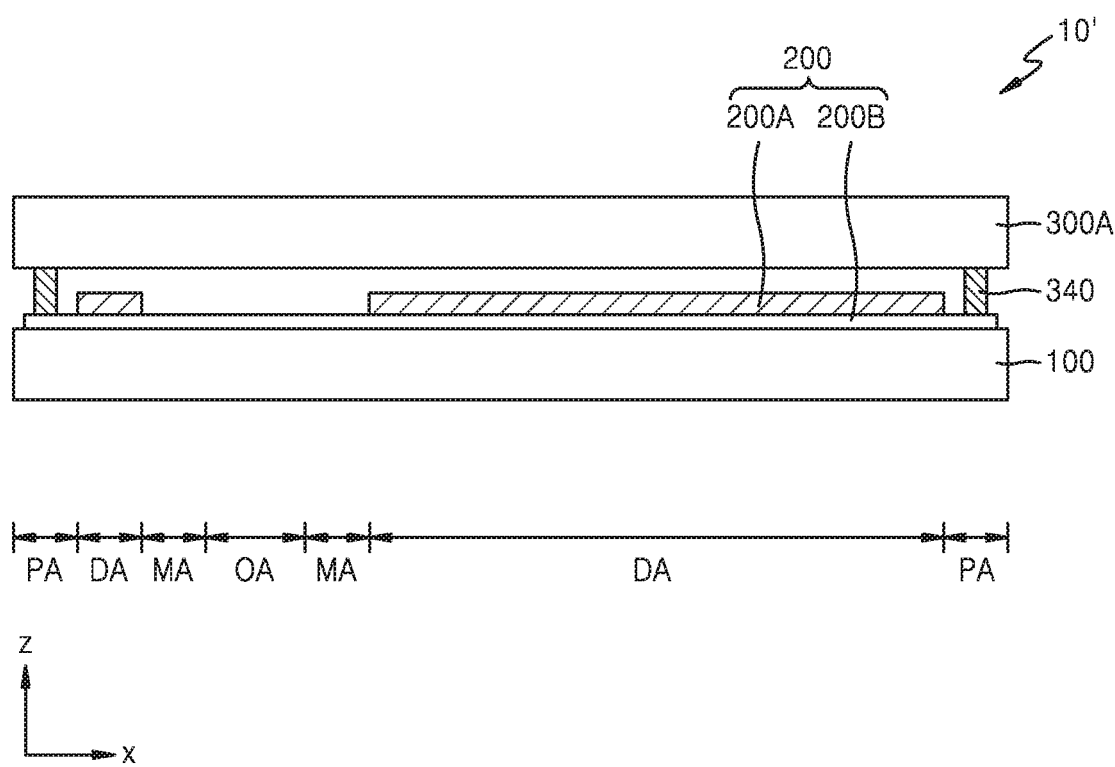
Figure 24D:
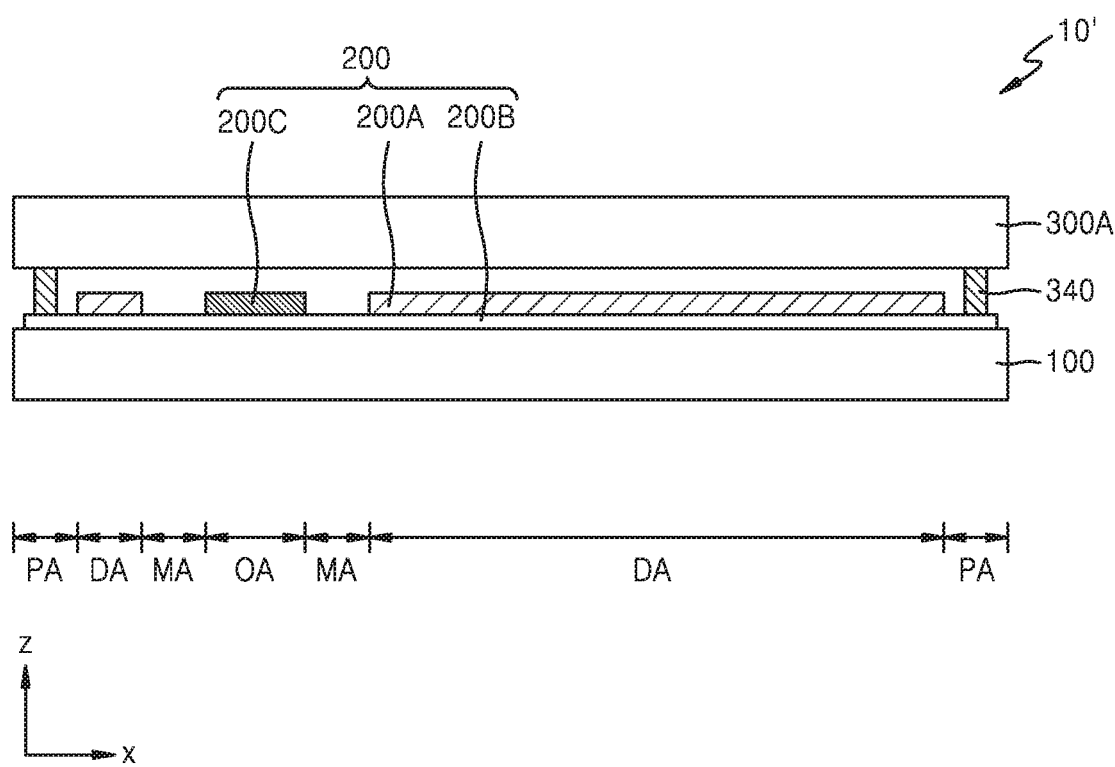

As shown in FIGS. 24A to 24C, one or more of the substrate 100, the display layer 200, and the encapsulation substrate 300A may have through-holes 100H, 200H, and 300AH corresponding to the first area OA. The display element layer 200A may not be disposed in the first area OA, or the auxiliary display element layer 200C may be disposed in the first area OA as shown in FIG. 24D. The auxiliary display element layer 200C has been described above with reference to FIG. 23D.

Figure 25:
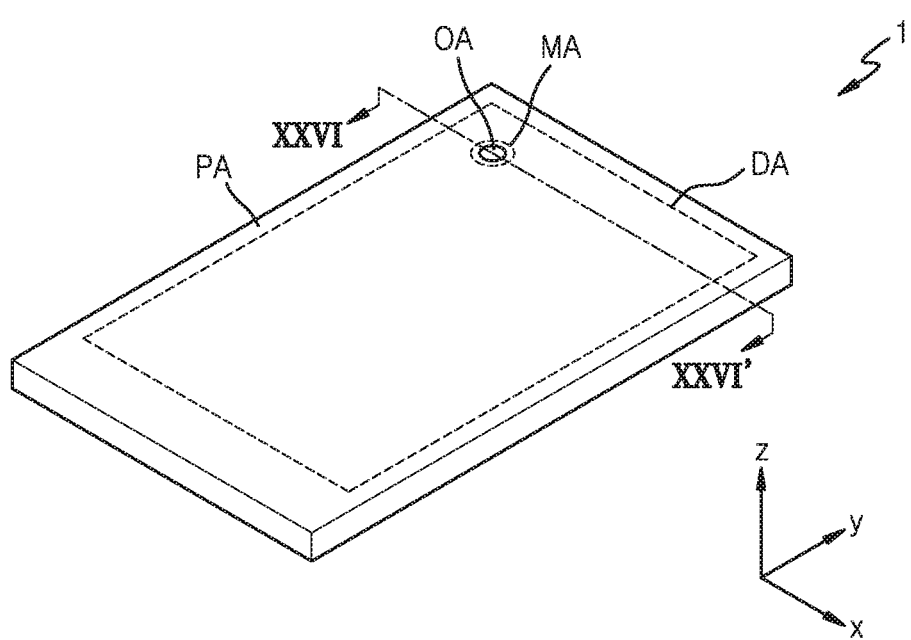
FIG. 25 is a perspective view of a display device including a display panel according to an exemplary embodiment of the present invention.
Figure 26A:
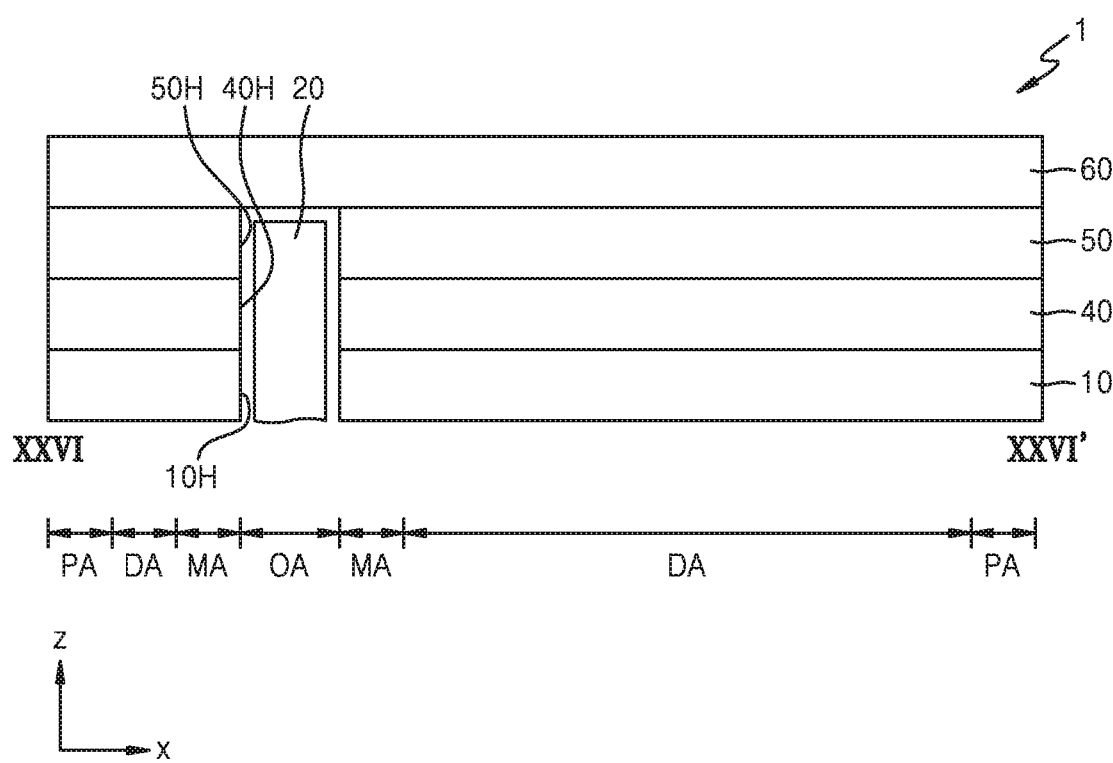
FIGS. 26A and 26B are cross-sectional views taken along line XXVI-XXVI' of FIG. 25, respectively.
Figure 26B:
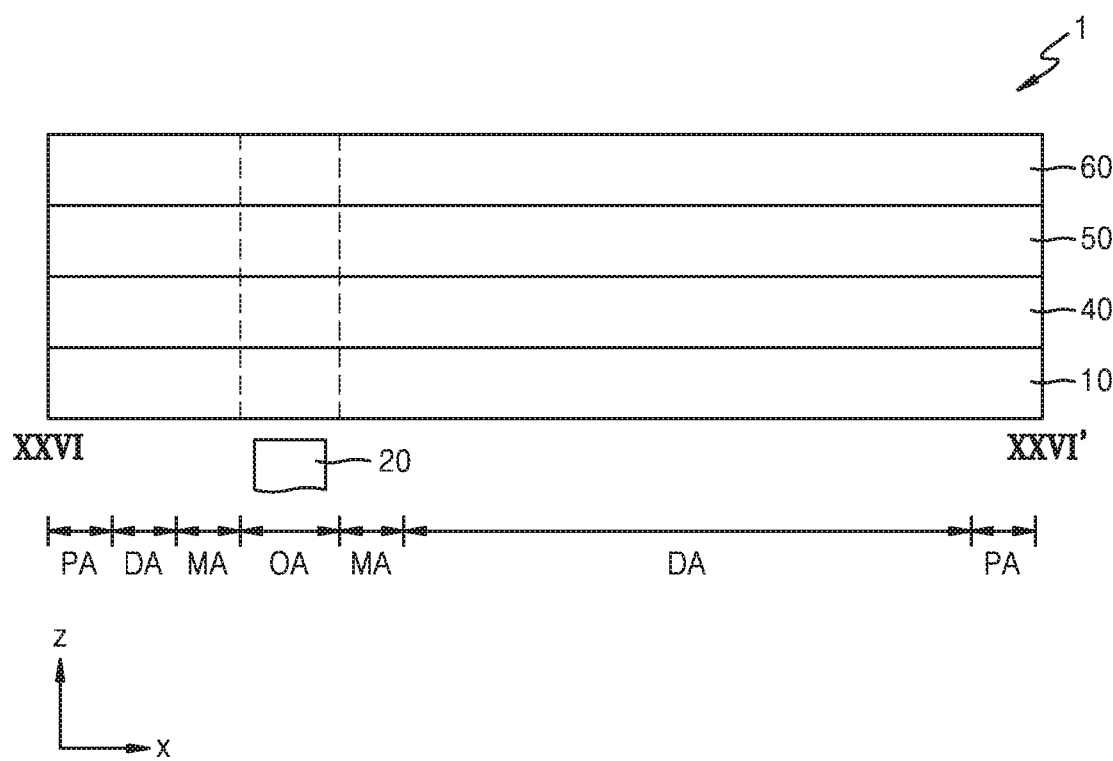

FIG. 25 is a perspective view of a display device including a display panel according to an exemplary embodiment, and FIGS. 26A and 26B are cross-sectional views taken along line XXVI-XXVI' of FIG. 25, respectively.

Referring to FIG. 25, a display device 1 includes the first area OA, the display area DA which is a second area, the intermediate area MA between the first area OA and the display area DA, and the peripheral area PA surrounding the display area DA. The display device 1 may provide a certain image using light emitted from a plurality of pixels arranged in the display area DA. FIG. 25 shows that one first area OA is disposed inside the display area DA, wherein the first area OA may be entirely surrounded by the display area DA. The first area OA may be an area in which elements to be described later below are disposed with reference to FIGS. 26A and 26B.

The intermediate area MA is disposed as a third area between the first area OA and the display area DA which is a second area, and the display area DA may be surrounded by the peripheral area PA which is a fourth area. The intermediate area MA and the peripheral area PA may be a kind of non-display area in which pixels are not disposed. The intermediate area MA may be entirely surrounded by the display area DA, and the display area DA may be entirely surrounded by the peripheral area PA.

Referring to FIG. 26A, the display device 1 may include the display panel 10, an input sensing layer 40 on the display panel 10, and an optical functional layer 50, which may be covered with a window 60. The display device 1 may be one of a variety of electronic devices, such as a mobile phone, a laptop computer, and a smart watch.

The input sensing layer 40 may be on the display panel 10. The input sensing layer 40 obtains coordinate information according to an external input, for example, a touch event. The input sensing layer 40 may include a sensing electrode (or a touch electrode) and trace lines connected to the sensing electrode. The input sensing layer 40 may be arranged on the display panel 10. The input sensing layer 40 may sense an external input by a mutual capacitance method and/or a self capacitance method.

The input sensing layer 40 may be formed directly on the display panel 10 or may be formed separately and then coupled to the display panel 10 through an adhesive layer such as an optical clear adhesive. For example, the input sensing layer 40 may be continuously formed after the process of forming the display panel 10. In this case, the input sensing layer 40 may be a portion of the display panel 10, and the adhesive layer may not be disposed between the input sensing layer 40 and the display panel 10. Although FIG. 26A illustrates that the input sensing layer 40 is between the display panel 10 and the optical functional layer 50, in another exemplary embodiment, the input sensing layer 40 may be on the optical functional layer 50.

The optical functional layer 50 may include an antireflective layer. The antireflective layer may reduce the reflectance of light (external light) incident from the outside toward the display panel 10 through the window 60. The antireflective layer may include a retarder and a polarizer. The retarder may be of a film type or a liquid crystal coating type, and may include a λ/2 retarder and/or a λ/4 retarder. The polarizer may also be of a film type or a liquid crystal coating type. A film type polarizer may include a stretch-type synthetic resin film, and a liquid crystal coating type polarizer may include liquid crystals arranged in the certain arrangement. The retarder and the polarizer may further include a protective film. The protective film of the retarder and the polarizer may be defined as a base layer of the anti-reflective layer.

In another exemplary embodiment, the antireflection layer may include a black matrix and color filters. The color filters may be arranged considering the color of light emitted from each of the pixels of the display panel 10. Each of the color filters may include a red, green, or blue pigment or dye. Alternatively, each of the color filters may further include a quantum dot in addition to the aforementioned pigment or dye. Alternatively, some of the color filters may not include the aforementioned pigment or dye and may include scattering particles such as titanium oxide.

In another exemplary embodiment, the antireflective layer may include a destructive interference structure. The destructive interference structure may include a first reflective layer and a second reflective layer on respective layers. First reflected light and second reflected light respectively reflected by the first reflective layer and second reflective layer may destructively interfere with each other, and thus, external light reflectance may be reduced.

The optical functional layer 50 may include a lens layer. The lens layer may improve luminous efficiency light emitted from the display panel 10 or may reduce color deviation. The lens layer may include a layer having a concave or convex lens shape or/and may include a plurality of layers having different refractive indices. The optical functional layer 50 may include all or any one of the above-described antireflective layer and lens layer.

In an exemplary embodiment, the optical functional layer 50 may be continuously formed after the process of forming the display panel 10 and/or the input sensing layer 40. In this case, the adhesive layer may not be disposed between the optical functional layer 50 and the display panel 10 and/or the input sensing layer 40.

The display panel 10, the input sensing layer 40, and/or the optical functional layer 50 may include openings. In this regard, FIG. 26A shows that the display panel 10, the input sensing layer 40, and the optical functional layer 50 include first to third openings 10H, 40H, and 50H, respectively, and the three openings, that is, the first to third openings 10H, 40H, and 50H overlap each other. The first to third openings 10H, 40H, and 50H are located to correspond to the first area OA. In another embodiment, one or more of the display panel 10, the input sensing layer 40, and the optical functional layer 50 may not include an opening. For example, any one or two elements selected from the display panel 10, the input sensing layer 40, and the optical functional layer 50 may not include an opening. Alternatively, the display panel 10, the input sensing layer 40, and the optical functional layer 50 may not include an opening, as illustrated in FIG. 26B.

As described above, the first area OA may be a kind of component area (e.g., a sensor area, a camera area, a speaker area, etc.) in which a component 20 for adding various functions to the display device 1 is located. The component 20 may be located in the first to third openings 10H, 40H, and 50H as shown in FIG. 26A. Alternatively, the component 20 may be under the display panel 10 as shown in FIG. 26B.

The component 20 may include an electronic element. For example, the component 20 may include an electronic component utilizing light or sound. For example, the electronic element may include a sensor that outputs and/or receives light, such as an infrared sensor, a camera that captures an image by receiving light, a sensor that outputs and detects light or sound to measure the distance or recognize fingerprints, a small lamp that outputs light, a speaker that outputs sound, and the like. In the case of an electronic element using light, light of various wavelength bands such as visible light, infrared light, ultraviolet light, and the like may be used. In some exemplary embodiments, the first area OA may be a transmission area in which light and/or sound that is output from the component 20 to the outside or that travels from the outside toward the electronic element may be transmitted.

In another exemplary embodiment, when the display device 1 is used as a smart watch or a vehicle instrument panel, the component 20 may be a member such as a clock needle or a needle indicating certain information (e.g., vehicle speed, etc.). When the display device 1 includes a clock needle or a vehicle instrument panel, the component 20 may be exposed to the outside through the window 60 and the window 60 may include an opening corresponding to the first area OA.

The component 20 may include component(s) associated with the function of the display panel 10 as described above, or may include components, such as accessories, that increase aesthetics of the display panel 10. Although not shown in FIGS. 26A and 26B, an optically transparent adhesive may be disposed between the window 60 and the optical functional layer 50.

According to the inventive concepts, by efficiently arranging data lines around a first area provided inside a display area, a high quality image may be provided and the area occupied by the data lines around the first area may be minimized.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
   a substrate comprising a first area, a display area, and an intermediate area arranged between the first area and the display area;
   a plurality of data lines extending along a first direction in the display area; and
   a data distributor comprising switches electrically connected to the plurality of data lines,
   wherein:
   the plurality of data lines comprise a first data line and a second data line, each of the first data line and the second data line bypasses an edge of the first area in the intermediate area, and a bypass portion of the first data line and a bypass portion of the second data line overlap each other in the intermediate area; and
   the bypass portion of the first data line and the bypass portion of the second data line are overlapped with a voltage layer that has a shape completely surrounding the first area in a plan view.

2. The display panel of claim 1, wherein:
   the data distributor comprises a first switch electrically connected to the first data line, and a second switch electrically connected to the second data line; and
   the first switch and the second switch are connected to a same demultiplexer control line.

3. The display panel of claim 1, wherein:
   the plurality of data lines further comprise a third data line and a fourth data line that bypass the edge of the first area in the intermediate area; and
   a bypass portion of the third data line and a bypass portion of the fourth data line overlap each other in the intermediate area.

4. The display panel of claim 3, wherein a shortest distance between the bypass portion of any one of the first data line and the second data line and the bypass portion of any one of the third data line and the fourth data line is greater than a vertical distance between the bypass portion of the first data line and the bypass portion of the second data line or a vertical distance between the bypass portion of the third data line and the bypass portion of the fourth data line.

5. The display panel of claim 4, wherein a separation distance between the first data line and the third data line in the display area is greater than the shortest distance.

6. The display panel of claim 4, wherein the third data line is arranged between the first data line and the second data line in the display area.

7. The display panel of claim 6, further comprising a first pixel circuit and a second pixel circuit located in the display area and arranged in the first direction,
   wherein one of the first data line and the third data line is connected to the first pixel circuit, and the other of the first data line and the third data line is electrically connected to the second pixel circuit.

8. The display panel of claim 1, wherein one of the first data line and the second data line comprises:
   the bypass portion in the intermediate area; and
   an extension portion located in the display area and connected to the bypass portion through a contact hole, the contact hole being defined in at least one insulating layer between the bypass portion and the extension portion.

9. The display panel of claim 1, wherein the plurality of data lines further comprise:
   a fifth data line spaced apart from the first data line and the second data line in the display area; and
   a bypass portion of the fifth data line bypassing the edge of the first area in the intermediate area, the bypass portion of the fifth data line overlapping the bypass portion of the first data line and the bypass portion of the second data line.

10. A display panel comprising:
    a substrate comprising a first area, a display area, and an intermediate area between the first area and the display area;
    a plurality of pixels located in the display area; and
    a plurality of data lines providing data signals to the plurality of pixels,
    wherein:
    the plurality of data lines comprise a first data line and a second data line, each of which comprises an extension portion extending in a first direction in the display area and a bypass portion bypassing the first area in the intermediate area;
    the bypass portion of the first data line and the bypass portion of the second data line overlap each other in the intermediate area; and
    the bypass portion of the first data line and the bypass portion of the second data line are overlapped with a voltage layer that has a shape completely surrounding the first area in a plan view.

11. The display panel of claim 10, wherein:
    the bypass portion and the extension portion of the first data line are disposed on a same layer, and
    the bypass portion and the extension portion of the second data line are disposed on different layers.

12. The display panel of claim 11, wherein:
    the plurality of data lines further comprise a third data line and a fourth data line, each of which comprises an extension portion extending in the first direction in the display area and a bypass portion bypassing the first area in the intermediate area; and
    the bypass portion of the third data line and the bypass portion of the fourth data line overlap each other in the intermediate area.

13. The display panel of claim 12, wherein at least one of the third data line and the fourth data line is arranged between the first data line and the second data line in the display area.

14. The display panel of claim 12, further comprising a first pixel circuit and a second pixel circuit located in the display area and arranged in the first direction,
    wherein the third data line is disposed adjacent to the first data line in the display area, and any one of the first data line and the third data line is electrically connected to the first pixel circuit and the other of the first data line and the third data line is electrically connected to the second pixel circuit.

15. The display panel of claim 12, wherein a shortest distance between the bypass portion of any one of the first data line and the second data line and the bypass portion of any one of the third data line and the fourth data line is greater than a vertical distance between the bypass portion of the first data line and the bypass portion of the second data line or a vertical distance between the bypass portion of the third data line and the bypass portion of the fourth data line.

16. The display panel of claim 15, wherein a separation distance between the first data line and the third data line in the display area is greater than the shortest distance.

17. The display panel of claim 10, further comprising a data distributor comprising switches electrically connected to the plurality of data lines.

18. The display panel of claim 17, wherein the data distributor comprises:
a first switch electrically connected to the first data line; and
a second switch electrically connected to the second data line.

19. The display panel of claim 18, wherein the first switch and the second switch are electrically connected to a same demultiplexer control line.

20. The display panel of claim 10, wherein:
the plurality of data lines further comprise:
a fifth data line spaced apart from the first data line and the second data line in the display area; and
a bypass portion of the fifth data line bypassing the edge of the first area in the intermediate area; and
the bypass portion of the fifth data line overlaps the bypass portion of the first data line and the bypass portion of the second data line.

* * * * *